United States Patent [19]
Hirano

[11] Patent Number: 5,650,742
[45] Date of Patent: Jul. 22, 1997

[54] VOLTAGE-LEVEL SHIFTER

[75] Inventor: Hiroshige Hirano, Nara, Japan

[73] Assignee: Matsushita Electric Industrial Co., Ltd., Osaka, Japan

[21] Appl. No.: 413,074

[22] Filed: Mar. 29, 1995

[30] Foreign Application Priority Data

Mar. 30, 1994 [JP] Japan .................................. 6-060774
Mar. 20, 1995 [JP] Japan .................................. 7-060716

[51] Int. Cl.⁶ ........................ H03K 19/094; H03L 5/00
[52] U.S. Cl. ........................ 327/333; 327/55; 327/391; 326/81
[58] Field of Search ........................ 327/318, 319, 327/391, 427, 437, 333, 374, 170, 55, 57; 326/81, 27, 68, 80

[56] References Cited

U.S. PATENT DOCUMENTS

| | | | |
|---|---|---|---|
| 4,565,960 | 1/1986 | Takata et al. | 327/437 |
| 4,663,701 | 5/1987 | Stotts | 327/333 |
| 4,816,706 | 3/1989 | Dhong et al. | 327/57 |
| 4,818,901 | 4/1989 | Young et al. | 326/27 |
| 4,888,501 | 12/1989 | Sanwo et al. | 327/333 |
| 4,970,409 | 11/1990 | Wada et al. | 327/541 |
| 4,973,864 | 11/1990 | Nogami | 327/55 |
| 4,978,870 | 12/1990 | Chen et al. | 307/475 |
| 4,980,583 | 12/1990 | Dietz | 307/475 |
| 4,985,644 | 1/1991 | Okihara et al. | 326/27 |
| 5,036,232 | 7/1991 | Jungert et al. | 327/180 |
| 5,113,097 | 5/1992 | Lee | 307/475 |
| 5,124,579 | 6/1992 | Naghshineh | 326/27 |
| 5,157,281 | 10/1992 | Santin et al. | 327/566 |
| 5,204,557 | 4/1993 | Nguyen | 326/81 |

FOREIGN PATENT DOCUMENTS 1-272227  10/1989  Japan .

Primary Examiner—Timothy P. Callahan
Assistant Examiner—My-Trang Nu Ton
Attorney, Agent, or Firm—McDermott, Will & Emery

[57] ABSTRACT

In a voltage-level shifter, a P-channel MOS transistor (early cut-off circuit) is interposed between a voltage source of the voltage-level shifter and a source of a P-channel MOS transistor which tends to be turned on when a voltage of a voltage source of an input signal supplies a low voltage or a large potential difference exists between the voltage source of the input signal and the voltage source of the voltage-level shifter, and is supplied on its gate with the input signal of the voltage-level shifter. Accordingly, the interposed P-channel MOS transistor is turned off prior to the P-channel MOS transistor having a tendency of being turned on, so that the voltage level of the output signal of the voltage-level shifter can be rapidly fixed at the "L" level.

25 Claims, 20 Drawing Sheets

VOLTAGE-LEVEL SHIFTER

BACKGROUND OF THE INVENTION

The present invention relates to an improvement of a voltage-level shifter.

A semiconductor device using a plurality of voltage sources requires a voltage-level shifter for shifting potentials of signals to potential levels of the respective voltage sources.

A voltage-level shifter in the prior art will be described below.

FIG. 31 shows a circuit structure of a conventional voltage-level shifter in the prior art, and FIG. 33 shows an operation timing of the conventional voltage-level shifter. In these figures, I30 indicates an input signal, O30 indicates an output signal, VCC indicates a first voltage source, VPP indicates a second voltage source, VSS indicates a ground voltage source, 3001 indicates a voltage-level shifter, Qn3001 and Qn3002 indicate N-channel MOS transistors, Qp3001 and Qp3002 indicate P-channel MOS transistors, and N3001 indicates a node name.

A circuit structure in FIG. 31 will be described below. The input signal I30 is connected to a source of the N-channel MOS transistor Qn3001 and a gate of the N-channel MOS transistor Qn3002. A gate of the N-channel MOS transistor Qn3001 is connected to the first voltage source VCC, and a source of the N-channel MOS transistor Qn3002 is connected to the ground voltage source VSS. A source of the P-channel MOS transistor Qp3001 and a source of the P-channel MOS transistor Qp3002 are connected to the second voltage source VPP. A drain of the N-channel MOS transistor Qn3001, a drain of the P-channel MOS transistor Qp3001 and a gate of the P-channel MOS transistor Qp3002 are connected together.

The output signal O30 is connected to a drain of the N-channel MOS transistor Qn3002, a gate of the P-channel MOS transistor Qp3001 and a drain of the P-channel MOS transistor Qp3002.

FIG. 32 shows a basic structure of the voltage-level shifter in FIG. 31. The structure in FIG. 32 differs from that in FIG. 31 in that an N-channel MOS transistor Qn3001' is supplied on its gate with a signal formed by inverting the input signal by an inverter INV32, has a source connected to the voltage source VSS of the input signal, and has a drain connected to the P-channel MOS transistor Qp3202. In other words, the structure in FIG. 31 eliminates the inverter circuit INV32 by employing the appropriate connection structure of the N-channel MOS element Qn3001, but performs the same operation as the basic structure in FIG. 32. Accordingly, the operation will be described below only in connection with the structure in FIG. 31.

Referring to an operation timing diagram of FIG. 33, the operation will be described below. When the input signal I30 is at the "L" (Low) level, the node N3001 is at the "L" level, the N-channel MOS transistor Qn3002 is off, P-channel MOS transistor Qp3002 is on, output signal O30 is at the "H" level set by the second voltage source VPP, and the P-channel MOS transistor Qp3001 is completely off. When the input signal I30 transits from the "L" level to the "H" level, the N-channel MOS transistor Qn3002 is completely turned off, the node N3001 attains a potential (VCC−Vtn) which is lower than the potential of the first voltage source VCC by a threshold voltage (Vtn) of the N-channel MOS transistor Qn3001, and the P-channel MOS transistor Qp3002 is substantially turned off. Then, the output signal O30 attains the "L" level, the P-channel MOS transistor Qp3001 is completely turned off, the node N3001 attains the potential of the second voltage source VPP, and the p-channel MOS transistor Qp3002 is completely turned off.

FIG. 34 shows another voltage-level shifter. This voltage-level shifter amplifies both the maximum and minimum values of an amplitude of an input signal to produce a signal having a large amplitude. The voltage-level shifter includes a signal inverter circuit SO inverting the input signal, a positive level shifter 51 which receives the input signal and an output signal of the signal inverter circuit SO to amplify the maximum value of the amplitude of the input signal, a negative level shifter 52 which receives the input signal and the output signal of the signal inverter circuit 50 to amplify the minimum value of the amplitude of the input signal, and a positive/negative level shifter S3 which receives output of the positive and negative level shifters 51 and 52 to compose them.

However, in the voltage-level shifters of the conventional structures shown in FIGS. 31 and 33, when the input signal I30 transits from the "L" level to the "H" level, the N-channel MOS transistor Qn3002 is completely off, and the P-channel MOS transistor Qp3002 is substantially off as already described. In particular, if the first voltage source VCC supplies a low voltage, and/or a large potential difference exists between the first and second voltage sources VCC and VPP, the P-channel MOS transistor Qp3002 is on. Therefore, a through current flows from the second voltage source VPP to the ground voltage source VSS via the N-channel MOS transistor Qn3002 and the P-channel MOS transistor Qp3002, which causes a disadvantage that the voltage level of the output signal O30 cannot fixed at the "L" level.

The conventional voltage-level shifter shown in FIG. 34 requires three level shifters and hence many transistors forming them, and is constructed to compose the shifted outputs of the positive and negative level shifters, resulting in reduction of the operation speed.

SUMMARY OF THE INVENTION

An object of the invention is to provide a voltage-level shifter which can operate as follows if a voltage source of an input signal supplies a low voltage and/or a large potential difference exists between a voltage source of an input signal and a voltage source of a voltage-level shifter. When the input signal transits from an "L" level to the "H" level, an MOS transistor to be turned off is surely controlled to be turned off, and a voltage level of an output signal of the voltage-level shifter is surely fixed at the "L" level while surely preventing flow of a through current.

Another object of the invention is to provide a voltage-level shifter, in which both maximum and minimum values of an input signal are amplified by level shift at one stage, so that a speed for the level shift can be improved, and component transistors are reduced in number to simplify a structure.

In order to achieve the above objects, a voltage-level shifter according to the invention is designed such that, when an input signal transits from the "L" level to the "H" level, electric charges are actively supplied to a gate of an MOS transistor to be turned off for controlling this MOS transistor to be surely turned off.

According to the voltage-level shifter of the invention, there is especially provided a circuit which fixes an output signal of the voltage-level shifter at the "L" level during transition of the level of the input signal from the "L" level to the "H" level, even if the MOS transistor to be turned off is turned on.

Further, the voltage-level shifter of the invention is provided with a plurality of voltage level shifter units which perform level shift of the potential of the input signal in stepwise fashion, whereby the potential of the output signal of the voltage-level shifter is fixed even if a large potential difference exists between the voltage source of the input signal and the voltage source of the voltage-level shifter.

Furthermore, according to the voltage-level shifter of the invention, a level shifter for amplifying the maximum amplitude value of the input signal and a level shifter for amplifying the minimum amplitude value of the same are appropriately combined together to perform amplification with level shift at a single stage.

More specifically, a voltage-level shifter of the invention includes a signal inverter circuit for inverting an input signal, and a level shifter using a voltage source supplying a potential higher than a potential of the input signal as a power source. The level shifter includes first and second MOS transistors of the same conductivity type, first and second MOS switch elements of a conductivity type opposite to that of the MOS transistors, and an electric charge supply circuit. Both the MOS transistors have sources connected to the voltage source. The first MOS transistor has a drain connected to a gate of the second MOS transistor and the first switch element. The second MOS transistor has a drain connected to a gate of the first MOS transistor and the second MOS switch element. The first MOS switch element is operable to interruptibly supply a ground potential to the gate of the second MOS transistor. The second MOS switch element is grounded. One of the first and second MOS switch elements is controlled by the input signal sent to the signal inverter circuit, and the other is controlled by the output signal of the signal inverter circuit. A potential of the drain of the second MOS transistor is an output signal of the level shifter. The electric charge supply circuit supplies positive charges to the gate of the second MOS transistor when the input signal sent to the signal inverter circuit transits from the "L" level to the "H" level.

A voltage-level shifter of the invention includes a signal inverter circuit for inverting an input signal, and a level shifter using a voltage source supplying a potential higher than a potential of the input signal as a power source. The level shifter includes first and second MOS transistors of the same conductivity type, first and second MOS switch elements of a conductivity type opposite to that of the MOS transistors, and an early cut-off circuit. Both the MOS transistors have sources connected to the voltage source. The first MOS transistor has a drain connected to a gate of the second MOS transistor and the first switch element. The second MOS transistor has a drain connected to a gate of the first MOS transistor and the second MOS switch element. The first MOS switch element is operable to interruptibly supply a ground potential to the gate of the second MOS transistor. The second MOS switch element is grounded. One of the first and second MOS switch elements is controlled by the input signal sent to the signal inverter circuit, and the other is controlled by the output signal of the signal inverter circuit. A potential of the drain of the second MOS transistor is an output signal of the level shifter. The early cut-off circuit is disposed at one of positions between the voltage source and the source of the second MOS transistor, between the drain of the second MOS transistor and the gate of the first MOS transistor, between the voltage source and the source of the first MOS transistor, and between the drain of the first MOS transistor and the gate of the second MOS transistor. The early cut-off circuit is turned off at a timing earlier than an off timing of the second MOS transistor when the input signal sent to the signal inverter circuit transits from the "L" level to the "H" level.

Further, a voltage-level shifter according to the invention includes a plurality of voltage level shifter units each being formed of the aforementioned level shifter and connected in serial. Each voltage level shifter unit receives a signal of a predetermined potential and outputs a signal of a potential higher than that of the input signal. The voltage level shifter unit at an initial stage receives an external signal as its input signal. Each of the voltage level shifter units other than that in the initial stage receives the output signal of the voltage level shifter unit at a preceding stage as its input signal. Each voltage level shifter unit has a power source forming a voltage source of its own output signal. Each voltage source generates a potential lower than that of the voltage source at a preceding stage.

Moreover, the present invention provides a voltage-level shifter for receiving a signal of a predetermined amplitude and outputting a signal of an amplitude larger than that of the input signal. The voltage-level shifter includes a first N-channel MOS switch element and a first P-channel MOS switch element, first and second N-channel MOS transistors, first and second P-channel MOS transistors, first and second voltage sources forming voltage sources of the input signal, and third and fourth voltage sources forming voltage sources of the output signal. The first N-channel MOS switch element is connected to a gate of the second P-channel MOS transistor. A potential of the first voltage source is interruptibly supplied to the gate of the second P-channel MOS transistor in accordance with the potential of the input signal. The first P-channel MOS switch element is connected to a gate of the second N-channel MOS transistor. A potential of the second voltage source is interruptibly supplied to the gate of the second N-channel MOS transistor in accordance with the potential of the input signal. A drain of the first P-channel MOS transistor is connected to a gate of the second P-channel MOS transistor. A drain of the first N-channel MOS transistor is connected to a gate of the second N-channel MOS transistor. Sources of the first and second P-channel MOS transistors are connected to the third voltage source. Sources of the first and second N-channel MOS transistors are connected to the fourth voltage source. A gate of the first P-channel MOS transistor, a drain of the second P-channel MOS transistor, a gate of the first N-channel MOS transistor and a drain of the second N-channel MOS transistor are connected together to form a common connection, of which potential is used as the output signal.

According to the voltage-level shifter of the invention thus constructed, when the input signal transits from the "L" level to the "H" level, the electric charge supply circuit supplies electric charges to the gate of the second MOS transistor, so that the off state of the second MOS transistor changes toward the complete off state. Therefore, even when the voltage source VCC of the input signal supplies a low voltage, and/or a large potential difference exists between the voltage source VCC of the input signal and the voltage source VPP of the level shifter, the output signal is surely fixed at the "L" level. It is possible to restrict effectively a through current flowing from the voltage source VPP of the level shifter to the ground VSS.

According to the voltage-level shifter of the invention, when the input signal transits from the "L" level to the "H" level, the early cut-off circuit is turned off at a timing earlier than the off timing of the second MOS transistor. Therefore, even if the second MOS transistor is not surely turned off when the voltage source VCC of the input signal supplies a low voltage, and/or a large potential difference exists between the voltage source VCC of the input signal and the voltage source VPP of the level shifter, the output signal is surely fixed at the "L" level. Also, it is possible to restrict effectively a through current flowing from the voltage source VPP of the level shifter to the ground VSS.

Further, according to the voltage-level shifter of the invention, since multiple voltage level shifter units connected in serial are used to change the potential of the input signal to the potential of the voltage source VPP in stepwise fashion, the voltage level of the output signal of the voltage-level shifter can be fixed even when a large potential difference exists between the voltage source VCC of the input signal and the voltage source VPP of the voltage-level shifter.

Furthermore, according to the voltage-level shifter of the invention, the amplitude of the input signal is increased by the level shift at a single stage for outputting the signal of a large amplitude, so that the operation of shifting the voltage level can be performed fast, and required transistors can be reduced in number.

Other objects, features and advantages of the invention will appear more fully from the following detailed description thereof taken in connection with the accompanying drawings.

BRIEF DESCRIPTION OF THE DRAWINGS

In the accompanying drawings showing preferred embodiments of the invention.

DESCRIPTION OF THE PREFERRED EMBODIMENTS

Preferred embodiments of the invention will be described below with reference to the drawings.

[First Embodiment]

A voltage-level shifter of a first embodiment of the invention will now be described below.

Figure 1:
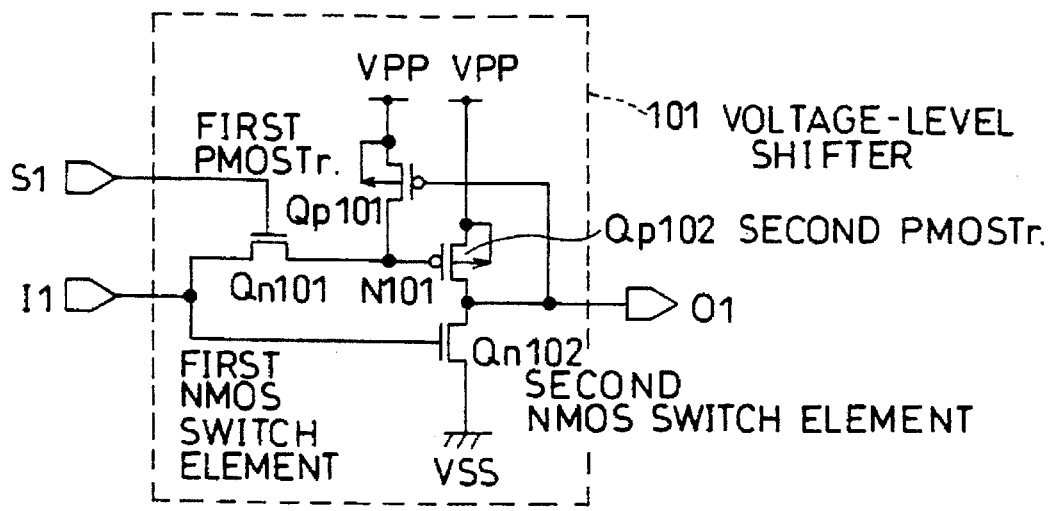
FIG. 1 shows a structure of a first embodiment of a voltage-level shifter of the invention.
Figure 2:
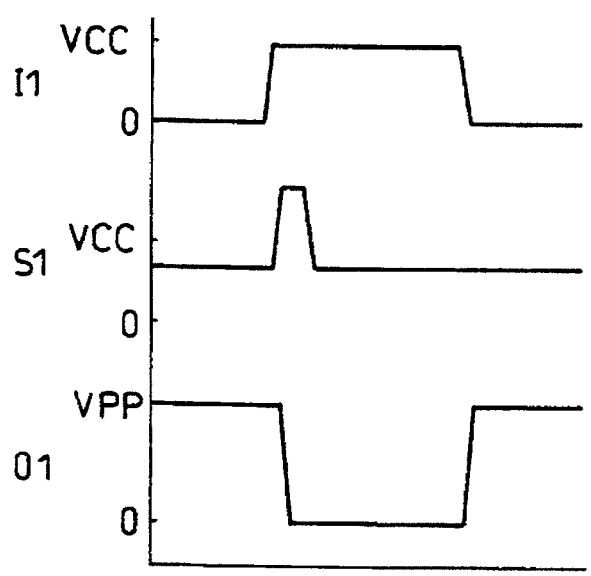
FIG. 2 shows an operation timing of the first embodiment of the voltage-level shifter of the invention.
Figure 3:
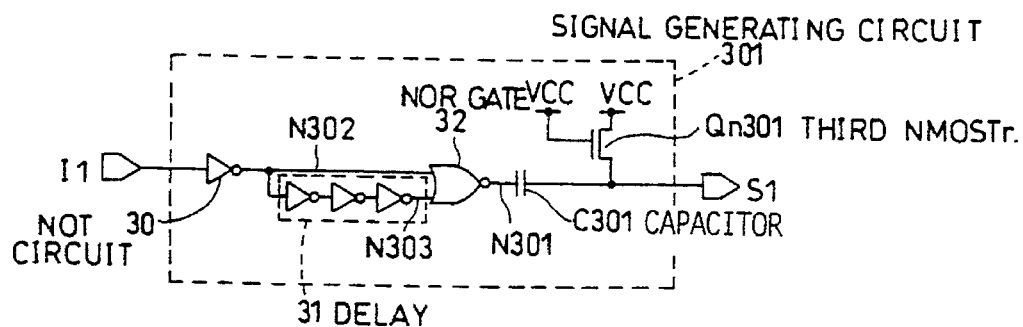
FIG. 3 shows a structure of the first embodiment of the voltage-level shifter of the invention.
Figure 8:
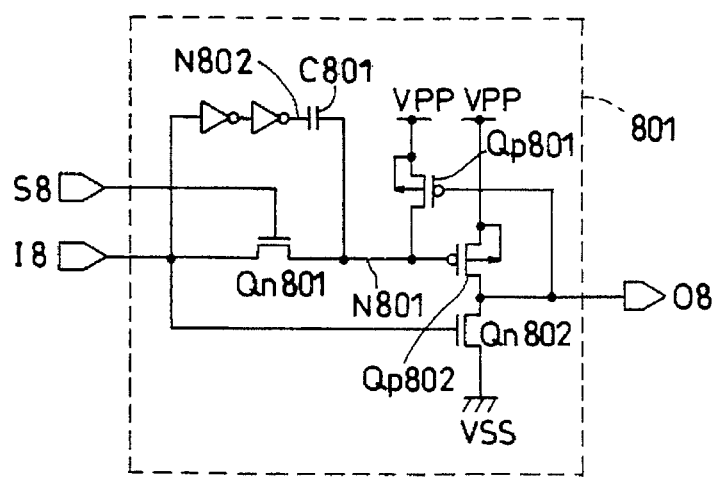
FIG. 8 shows a structure of a fourth embodiment of the voltage-level shifter of the invention.

FIGS. 1 and 3 show a circuit structure, and FIG. 2 shows an operation timing. In FIGS. 1 and 8, I1 and S1 indicate input signals, O1 indicates an output signal, 101 indicates a voltage-level shifter, 301 indicates a signal generating circuit (electric charge supply circuit), VCC indicates a first voltage source (voltage source of the input signal), VPP indicates a second voltage source (voltage source of the voltage-level shifter) and VSS indicates a ground voltage source.

In the voltage-level shifter 101 in FIG. 1, Qn101 indicates an N-channel MOS transistor (first N-channel switch element), Qn102 indicates an N-channel MOS transistor (second N-channel switch element), Qp101 indicates a P-channel MOS transistor (first P-channel MOS transistor) and Qp102 indicates a P-channel MOS transistor (second P-channel MOS transistor).

In the signal generating circuit (electric charge supply circuit) 301 in FIG. 8, Qn301 indicates an N-channel MOS transistor (third N-channel MOS transistor), C301 indicates a capacitor, N101 and N301–N303 indicate node names, 30 indicates a NOT circuit, 31 indicates a delay circuit, and 32 indicates an NOR gate.

A circuit structure in FIG. 1 will be described below. The input signal I1 is connected to a source of the N-channel MOS transistor Qn101 and a gate of the N-channel MOS transistor Qn102, and a gate of the N-channel MOS transistor Qn101 is connected to the input signal S1. A source of the N-channel MOS transistor Qn102 is connected to the ground voltage source VSS, and sources of the P-channel MOS transistors Qp101 and transistor Qp102 are connected to the second voltage source VPP. A drain of the N-channel MOS transistor Qn101, a drain of the P-channel MOS transistor Qp101 and a gate of the P-channel MOS transistor Qp102 are connected together, and the output signal O1 is connected to the drain of the N-channel MOS transistor Qn101, the drain of the P-channel MOS transistor Qp101 and the gate of the P-channel MOS transistor Qp102.

The circuit structure in FIG. 3 will be described below. A NOT signal of the input signal I1 is sent to the node N302. A delay signal of a phase opposite to that of the node 302 is sent to the node N303. An NOR (negative OR) between the nodes N302 and N303 is supplied to the node N301. The capacitor C301 is connected between the node N301 and the input signal S1. The input signal S1 is connected to the drain of the N-channel MOS transistor Qn301, of which source and gate are connected to the first voltage source VCC.

Owing to the connection structure of the N-channel MOS transistor Qn101, as already described, the circuit serves also as a signal inverter circuit for inverting the input signal I1.

An operation will be described below with reference to the operation timing diagram of FIG. 2. First, when the input signal I1 is at the "L" level, the node N301 in the signal generating circuit 301 is at the "L" level, and the input signal S1 is at a potential (VCC–Vtn) which is lower than the first voltage source VCC by a value corresponding to a threshold voltage (Vtn) of the N-channel MOS transistor Qn301. In the voltage-level shifter 101, the node N101 is at the "L" level, the N-channel MOS transistor Qn102 is off, the P-channel MOS transistor Qp102 is on, the output signal O1 is at the potential of the second voltage source VPP and thus at the "H" level, and the P-channel MOS transistor Qp101 is completely off. In the signal generating circuit 301, the node N301 generates a pulse signal changing between the "L" level and the "H" level during a delay time determined between the node N302 and the node N303.

Therefore, the input signal S1 connected to the node N301 via the capacitor C301 generates a pulse signal changing between a potential of (VCC–Vtn) and a potential of (2×VCC–Vtn). In the voltage-level shifter 101, since the input signal I1 is at the "H" level, the N-channel MOS transistor Qn102 is completely off. The node N101 is at the potential of (VCC–2×Vtn) when the input signal S1 is at the potential of (VCC–Vtn), but attains lower one between the potential of (2×VCC–Vtn) and the potential of the first voltage source VCC when the input signal S1 attains the potential of (2×VCC–Vtn). Assuming that VCC is 1.5 V and Vtn is 0.7 V, the node N101 attains the potential VCC. As described above, since the node N101 is set to VCC, the P-channel MOS transistor Qp102 is substantially turned off. Then, the output signal O1 attains the "L" level, and the P-channel MOS transistor Qp101 is completely turned on, so that the node N101 attains the potential of the second voltage source VPP, and the P-channel MOS transistor Qp102 is completely turned off.

The foregoing voltage-level shifter 101 has such a feature that, when the input signal I1 transits from the "L" level to the "H" level, the potential of the input signal S1 is raised to or above the first voltage source VCC, and the node N101 is set to the potential of the first voltage source VCC, whereby the P-channel MOS transistor Qp102 is substantially turned off. Thereby, it is possible to suppress a through current flowing from the second voltage source VPP to the ground voltage source VSS via the N-channel MOS transistor Qn102 and the P-channel MOS transistor Qp102, and the voltage level of the output signal O1 can be rapidly fixed at the "L" level. In particular, even when the first voltage source VCC supplies a low voltage, and/or there is a large potential difference between the first and second voltage sources VCC and VPP, the voltage level of the output signal O1 can be rapidly fixed at the "L" level.

[Second Embodiment]

A voltage-level shifter of a second embodiment of the invention will now be described below.

Figure 4:
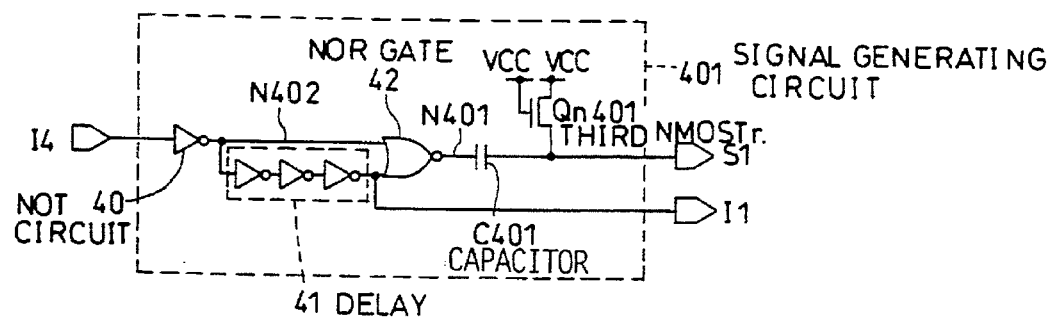
FIG. 4 shows a structure of a second embodiment of the voltage-level shifter of the invention.
Figure 5:
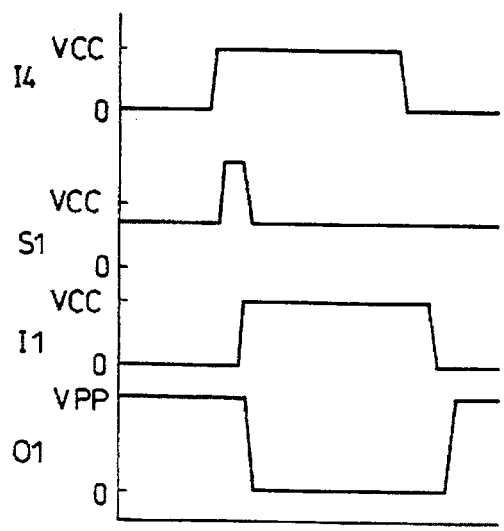
FIG. 5 shows an operation timing of the second embodiment of the voltage-level shifter of the invention.

FIGS. 1 and 4 show a circuit structure, and FIG. 5 shows an operation timing. In FIGS. 1 and 4, I1, I4 and S1 indicate input signals, O1 indicates an output signal, VCC indicates the first voltage source, VPP indicates the second voltage source and VSS indicates the ground voltage source. 101 indicates the voltage-level shifter, 401 indicates a signal generating circuit, Qn101, Qn102 and Qn401 indicate N-channel MOS transistors (third N-channel MOS transistor), Qp101 and Qp102 indicate P-channel MOS transistors. 40 indicates a NOT circuit, 41 indicates a delay circuit, and 42 indicates an NOR gate. C401 indicates a capacitor, and N401 and N402 indicate node names.

The circuit structure in FIG. 1 is the same as that of the first embodiment.

The circuit structure in FIG. 4 will be described below. A NOT signal of the input signal I4 is sent to the node N402, and an NOR between the node N402 and the input signal I1 is supplied to the node N401 as a delay signal of a phase opposite to that of the node N402. The capacitor C401 is connected between the node N401 and the input signal S1. The input signal S1 is connected to a drain of the N-channel MOS transistor Qn401, of which source and gate are connected to the first voltage source VCC.

An operation will be described below with reference to the operation timing diagram of FIG. 5. First, when the input signal I4 is at the "L" level, the input signal I1 in the signal generating circuit 401 is at the "L" level, the node N401 is at the "L" level, and the input signal S1 is at a potential (VCC–Vtn) which is lower than the first voltage source VCC by a value corresponding to a threshold voltage (Vtn) of the N-channel MOS transistor Qn401. In the voltage-level shifter 101, similarly to the first embodiment, the node N101 is at the "L" level, the N-channel MOS transistor Qn102 is off, the P-channel MOS transistor Qp102 is on, the output signal O1 is at the potential of the second voltage source VPP and thus at the "H" level, and the P-channel MOS transistor Qp101 is completely off.

When the input signal I4 transits from the "L" level to the "H" level, the signal generating circuit 401 operates such that the node N401 generates a pulse signal changing between the "L" level and the "H" level during a delay time of the input signal I1 from the node N402. Therefore, the input signal S1 connected to the node N401 via the capacitor C401 generates a pulse signal changing between a potential of (VCC–Vtn) and a potential of (2×VCC–Vtn). In the voltage-level shifter 101, the input signal I1 transits from the "L" level to the "H" level with a delay from input signal I4, and the N-channel MOS transistor Qn102 is completely turned off. The node N101 attains lower one between the potential of (2×VCC−Vtn) and the potential of the first voltage source VCC because the input signal S1 has already changed its potential from (VCC−Vtn) to (2×VCC−Vtn). Assuming that VCC is 1.5 V and Vtn is 0.7 V, the node N101 attains the potential VCC. As described above, since the node N101 attains VCC, the P-channel MOS transistor Qp102 is substantially turned off. Then, the output signal O1 attains the "L" level, and the P-channel MOS transistor Qp101 is completely turned on, so that the node N101 is set to the potential of the second voltage source VPP, and the P-channel MOS transistor Qp102 is completely turned off.

The foregoing voltage-level shifter 101 has such a feature that, when the input signal I1 transits from the "L" level to the "H" level, the input signal S1 is already raised to or above the first voltage source VCC, and thus the node N101 is set to the potential of the first voltage source VCC more rapidly than the first embodiment, whereby the P-channel MOS transistor Qp102 is substantially turned off. Thereby, it is possible to suppress a through current flowing from the second voltage source VPP to the ground voltage source VSS via the N-channel MOS transistor Qn102 and the P-channel MOS transistor Qp102, and the voltage level of the output signal O1 can be rapidly fixed at the "L" level. In particular, even when the first voltage source VCC supplies a low voltage, and/or there is a large potential difference between the first and second voltage sources VCC and VPP, the voltage level of the output signal O1 can be rapidly fixed at the "L" level.

[Third Embodiment]

A voltage-level shifter of a third embodiment of the invention will now be described below.

Figure 6:
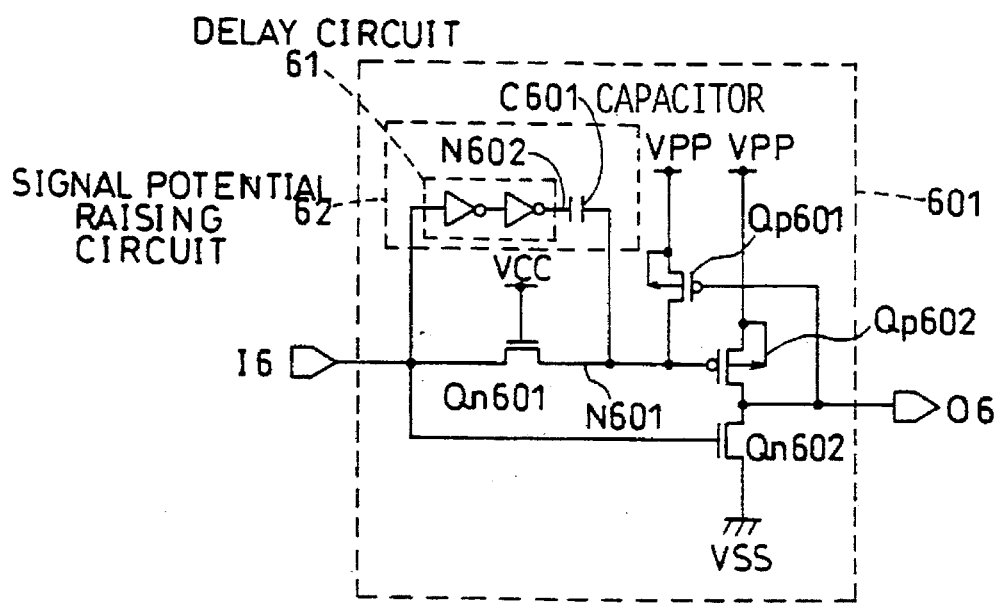
FIG. 6 shows a structure of a third embodiment of the voltage-level shifter of the invention.
Figure 7:
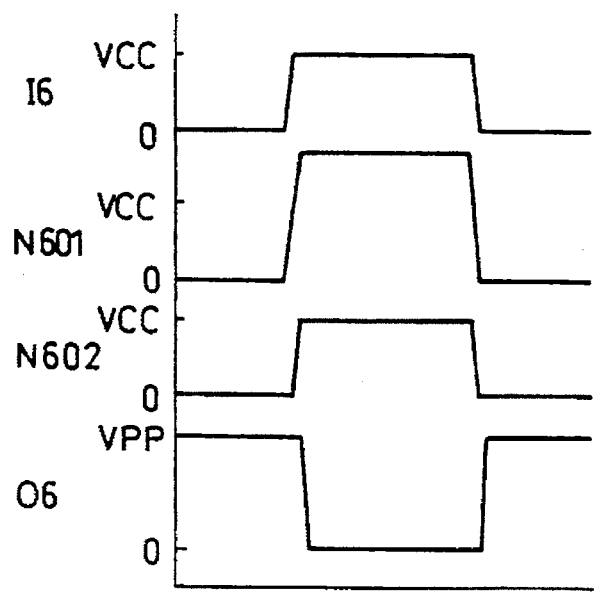
FIG. 7 shows an operation timing of the third embodiment of the voltage-level shifter of the invention.

FIG. 6 shows a circuit structure, and FIG. 7 shows an operation timing. I6 indicates an input signal, O6 indicates an output signal, VCC indicates the first voltage source, VPP indicates the second voltage source and VSS indicates the ground voltage source. 601 indicates a voltage-level shifter, Qn601 and Qn602 indicate N-channel MOS transistors, Qp601 and Qp602 indicate P-channel MOS transistors, C601 indicates a capacitor, 61 indicates a delay circuit, and N601 and N602 indicate node names.

The circuit structure in FIG. 6 will be described below. The input signal I6 is connected to a source of the N-channel MOS transistor Qn601 and a gate of the N-channel MOS transistor Qn602. A gate of the N-channel MOS transistor Qn601 is connected to VCC, and a source of the N-channel MOS transistor Qn602 is connected to VSS. A source of the P-channel MOS transistor Qn601 and a source of the P-channel MOS transistor Qp602 are connected to the second voltage source VPP.

A drain of the N-channel MOS transistor Qn601, a drain of the P-channel MOS transistor Qp601 and a gate of the P-channel MOS transistor Qp602 are connected together, and the output signal O6 is connected to the drain of the N-channel MOS transistor Qn601, the drain of the P-channel MOS transistor Qp601 and the gate of the P-channel MOS transistor Qp602. A delayed signal of the same phase as the input signal I6 is supplied to the node 602, and the capacitor C601 is connected between the nodes N601 and N602.

The delay circuit 61 and the capacitor C601 connected in serial form a signal potential raising circuit 62.

An operation will be described below with reference to the operation timing diagram of FIG. 7. First, when the input signal I6 is at the "L" level, the node N601 is at the "L" level, the node N602 is at the "L" level, the N-channel MOS transistor Qn602 is off, the P-channel MOS transistor Qp602 is on, the output signal O6 is at the potential of the second voltage source VPP and thus at the "H" level, and the P-channel MOS transistor Qp601 is completely turned off. When the input signal I6 transits from the "L" level to the "H" level, the node N601 attains the potential of (VCC−Vtn). Thereafter, the node N602 transits from the "L" level to the "H" level, and the node N601 attains the potential of (2×VCC−Vtn).

Since the input signal I6 is at the "H" level, the N-channel MOS transistor Qn602 is completely turned off, so that the node N601 attains the potential of (2×VCC−Vtn), and the P-channel MOS transistor Qp602 is substantially or completely turned off. Then, the output signal O6 attains the "L" level, and the P-channel MOS transistor Qp601 is completely turned off, so that the node N601 attains the potential of the second voltage source VPP, and the P-channel MOS transistor Qp602 is completely turned off.

The foregoing voltage-level shifter 601 has such a feature that, when the input signal I6 transits from the "L" level to the "H" level, the node N601 is set to the potential not lower than VCC, i.e., potential of (2×VCC−Vtn), whereby the P-channel MOS transistor Qp602 is substantially turned off. Thereby, it is possible to suppress a through current flowing from the second voltage source VPP to the ground voltage source VSS via the N-channel MOS transistor Qn602 and the P-channel MOS transistor Qp602. Also, the voltage level of the output signal O6 can be rapidly fixed at the "L" level. In particular, even when the first voltage source VCC supplies a low voltage, and/or there is a large potential difference between the first and second voltage sources VCC and VPP, the voltage level of the output signal O6 can be rapidly fixed at the "L" level.

[Fourth Embodiment]

A voltage-level shifter of a fourth embodiment of the invention will now be described below. The fourth embodiment corresponds to combination of the second and third embodiments already described.

Figure 9:
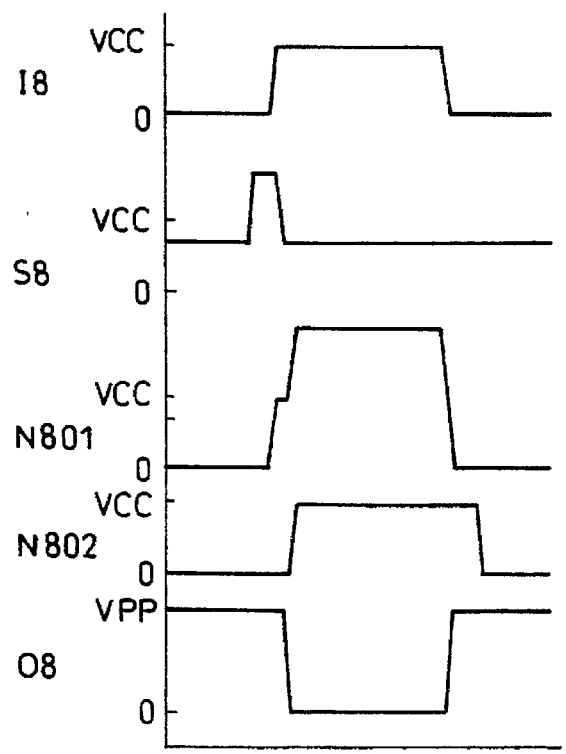
FIG. 9 shows an operation timing of the fourth embodiment of the voltage-level shifter of the invention.

FIG. 8 shows a circuit structure, and FIG. 9 shows an operation timing. I8 and S8 indicate input signals, O8 indicates an output signal, VCC indicates the first voltage source, VPP indicates the second voltage source and VSS indicates the ground voltage source. 801 indicates a voltage-level shifter, Qn801 and Qn802 indicate N-channel MOS transistors, Qp801 and Qp802 indicate P-channel MOS transistors, C801 indicates a capacitor, and N801 and N802 indicate node names.

The circuit structure in FIG. 8 will be described below. In the voltage-level shifter 801, the input signal I8 is connected to a source of the N-channel MOS transistor Qn801 and a gate of the N-channel MOS transistor Qn802. A gate of the N-channel MOS transistor Qn801 is connection to the input signal S8. A source of the P-channel MOS transistor Qp802 is connected to the ground voltage VSS. Source of the P-channel MOS transistors Qp801 and Qp802 are connected to the second voltage source VPP.

A drain of the N-channel MOS transistor Qn801, a drain of the P-channel MOS transistor Qp801 and a gate of the P-channel MOS transistor Qp802 are connected together. The output signal O8 is connected to the drain of the N-channel MOS transistor Qn802, the gate of the P-channel MOS transistor Qp801 and the drain of the P-channel MOS transistor Qp802. A delayed signal of the same phase as the input signal I8 is supplied to the node 802, and the capacitor C801 is connected between the nodes N801 and N802. The input signals I8 and S8 have such a relationship that the input signal I1 in the second embodiment shown in FIG. 4 corresponds to the input signal I8, and the input signal S1 corresponds to the input signal S8.

An operation will be described below with reference to the operation timing diagram of FIG. 9. The input signals I1 and S1 in FIG. 4 are supplied as the input signals I8 and S8 in FIG. 8. First, in the signal generating circuit 401 shown in FIG. 4, when the input signal I4 is at the "L" level, the signal I8 (I1) is at the "L" level, the node N401 is at the "L" level, and the input signal I8 is at the potential (VCC–Vtn) which is lower than the first voltage source VCC by the threshold voltage (Vtn) of the N-channel MOS transistor Qn401.

In the voltage-level shifter 801 in FIG. 8, the input signal I8 is at the "L" level, the node N801 is at the "L" level, the node N802 is at the "L" level, the N-channel MOS transistor Qn802 is off, the P-channel MOS transistor Qp802 is on, the output signal O8 is at the potential of the voltage source VPP and thus at the "H" level, and the P-channel MOS transistor Qp801 is completely turned off. When the input signal I4 transits from the "L" level to the "H" level, the signal generating circuit 401 in FIG. 4 operates such that the node N401 generates a pulse signal changing between the "L" level and the "H" level during a delay time of the input signal I8(I1) from the node N402. Therefore, the input signal S8 (I1) connected to the node N401 via the capacitor C401 generates a pulse signal changing between a potential of (VCC–Vtn) and a potential of (2×VCC–Vtn).

In the voltage-level shifter 801 in FIG. 8, the input signal I8 transits from the "L" level to the "H" level with a delay from input signal I4, and the N-channel MOS transistor Qn802 is completely turned on. The node N801 attains lower one between the potential of (2×VCC–Vtn) and the potential of the first voltage source VCC because the input signal S8 has already changed its potential from (VCC–Vtn) to (2×VCC–Vtn). Assuming that VCC is 1.5 V and Vtn is 0.7 V, the node N801 attains the potential of the first voltage source VCC. Thereafter, the node N802 transits from the "L" level to the "H" level, and the node N101 attains the potential of (2×VCC). Therefore, the P-channel MOS transistor Qp802 is substantially off. Then, the output signal O8 attains the "L" level, and the P-channel MOS transistor Qp801 is completely turned on, so that the node N801 is set to the potential of the second voltage source VPP, and the P-channel MOS transistor Qp802 is completely turned off.

The foregoing voltage-level shifter 801 has such a feature corresponding to combination of the features of the second and third embodiments already described, and specifically, such a feature that, when the input signal I8 transits from the "L" level to the "H" level, the voltage level of the output signal O8 can be rapidly fixed at the "L" level.

[Fifth Embodiment]

A voltage-level shifter of a fifth embodiment of the invention will now be described below.

Figure 10:
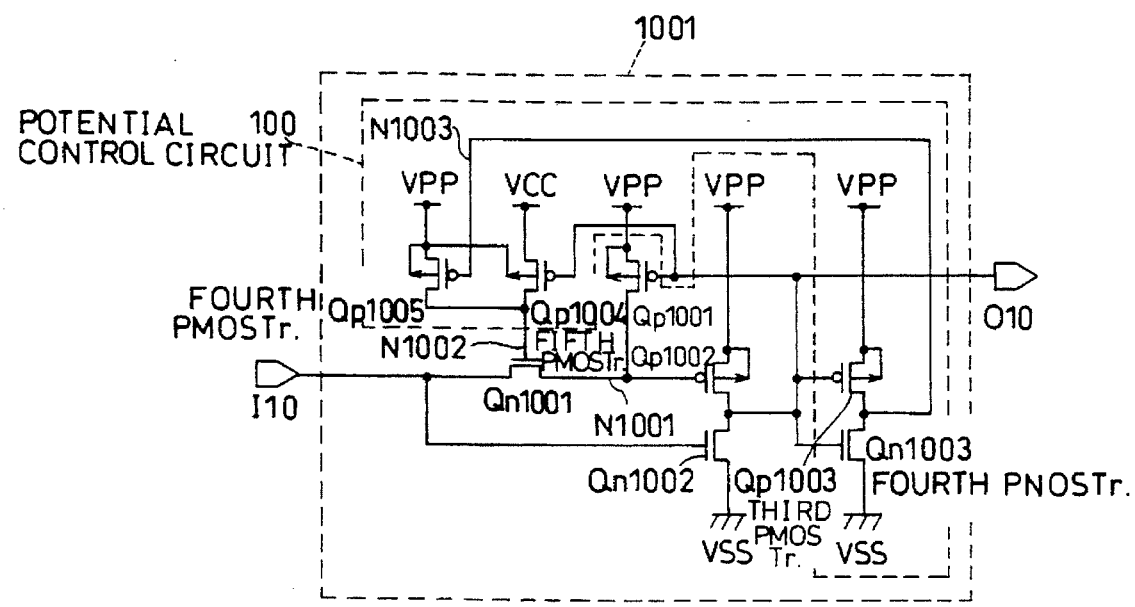
FIG. 10 shows a structure of a fifth embodiment of the voltage-level shifter of the invention.
Figure 11:
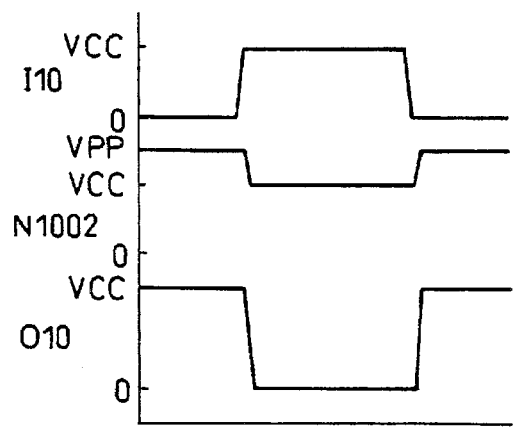
FIG. 11 shows an operation timing of the fifth embodiment of the voltage-level shifter of the invention.

FIG. 10 shows a circuit structure, and FIG. 11 shows an operation timing. In FIG. 10, I10 indicates an input signal, O10 indicates an output signal, VCC indicates the first voltage source, VPP indicates the second voltage source, and VSS indicates the ground voltage source. 1001 indicates a voltage-level shifter, Qn1001 and Qn1002 indicate N-channel MOS transistors, Qn1003 indicates an N-channel MOS transistor (fourth N-channel MOS transistor), Qp1001 and Qp1002 indicates P-channel MOS transistors, Qp1003 indicates a P-channel MOS transistor (third P-channel MOS transistor), Qp1004 indicates a P-channel MOS transistor (fifth P-channel MOS transistor), Qp1005 indicates a P-channel MOS transistor (fourth P-channel MOS transistor), and N1001–N1003 indicate node names.

The circuit structure in FIG. 10 will be described below. In the voltage-level shifter1001, the input signal I10 is connected to a source of the N-channel MOS transistor Qn1001 and a gate of the N-channel MOS transistor Qn1002. The node N1002 is connected to the gate of the N-channel MOS transistor Qn1001, a drain of the P-channel MOS transistor Qp1004 and a drain of the P-channel MOS transistor Qp1005.

A source of the N-channel MOS transistor Qn1002 is connected to the ground voltage source VSS. Sources of the P-channel transistors Qp1001–Qp1003 and Qp1005 are connected to the second voltage source VPP. A source of the P-channel MOS transistor Qp1004 is connected to the first voltage source VCC. The node N1001 is connected to a drain of the N-channel MOS transistor Qn1001, a drain of the P-channel MOS transistor Qp1001 and a gate of the P-channel MOS transistor Qp1002.

The output signal O10 is connected to a drain of the N-channel MOS transistor Qn1002, a gate of the P-channel MOS transistor Qp1001, a gate of the P-channel MOS transistor Qp1004, a drain of the P-channel MOS transistor Qp1002, a gate of the P-channel MOS transistor Qp1003 and a gate of the N-channel MOS transistor Qn1003. The node N1003 is connected to a drain of the P-channel MOS transistor Qp1003, a drain of the N-channel MOS transistor Qn1003 and a gate of the P-channel MOS transistor Qp1005. A source of the N-channel MOS transistor Qn1003 is connected to the ground voltage source VSS.

The third to fifth P-channel MOS transistors Qp1003–Qp1005 and the fourth N-channel MOS transistor Qn1003 form a potential control circuit (electric charge supply circuit) 100.

An operation will be described below with reference to the operation timing diagram of FIG. 11. When the input signal I10 is at the "L" level, the node N1001 is at the "L" level, the N-channel MOS transistor Qn1002 is off, and the P-channel MOS transistor Qp1002 is on. The output signal O10 is at the potential of the second voltage source VPP and thus at the "H" level. At this time, the N-channel MOS transistor Qn1003 is on, the P-channel MOS transistor Qp1003 is off, and the node N1003 is at the "L" level, so that the P-channel MOS transistors Qp1001 and Qp1004 are completely off, and the P-channel MOS transistor Qp1005 is on. The node N1002 is at the potential of the second voltage source VPP.

When the input signal I10 transits from the "L" level to the "H" level, the node N1001 attains lower one between the potential of (VCC–Vtn) and the potential of the first voltage source VCC. Assuming that VPP is 3.0 V, VCC is 1.5 V and Vtn is 0.7 V, the node N1001 attains the potential of the first voltage source VCC, i.e., 1.5 V. Thereafter, the N-channel MOS transistor Qn1002 is turned on, and the P-channel MOS transistor Qp1002 is substantially turned off. The output signal O10 attains the "L" level, the N-channel MOS transistor Qn1003 is turned off, and the P-channel MOS transistor Qp1003 is turned off. At this time, the node N1001 is at the potential of VPP, the P-channel MOS transistors Qp1001 and Qp1004 are on, and the P-channel MOS transistor Qp1005 is off, so that the node N1001 attains the potential of the second voltage source VPP. Further, the node N1002 attains the potential of the first voltage source VCC, and the P-channel MOS transistor Qp1002 is completely turned off.

The foregoing voltage-level shifter has such a feature that, when the input signal I10 transits from the "L" level to the "H" level, the node N1002 is at the potential not lower than the first voltage source VCC, and is used as the first voltage source VCC, whereby the P-channel MOS transistor Qp1002 is substantially turned off. Thereby, it is possible to suppress a through current flowing from the second voltage source VPP to the ground voltage source VSS via the N-channel MOS transistor Qn1002 and the P-channel MOS transistor Qp1002. Also, the voltage level of the output signal O10 can be rapidly fixed at the "L" level. In particular, even when the first voltage source VCC supplies a low voltage, and/or there is a large potential difference between the first and second voltage sources VCC and VPP, the voltage level of the output signal O10 can be rapidly fixed at the "L" level.

[Sixth Embodiment]

A voltage-level shifter of a sixth embodiment of the invention will now be described below.

Figure 12:
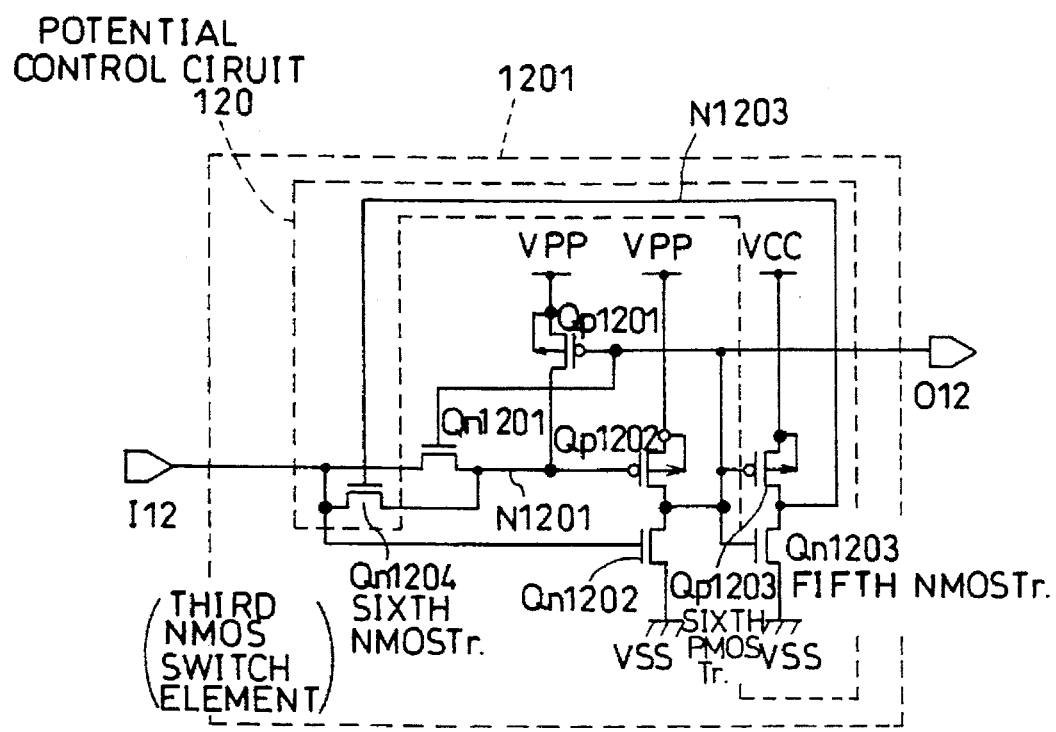
FIG. 12 shows a structure of a sixth embodiment of the voltage-level shifter of the invention.
Figure 18:
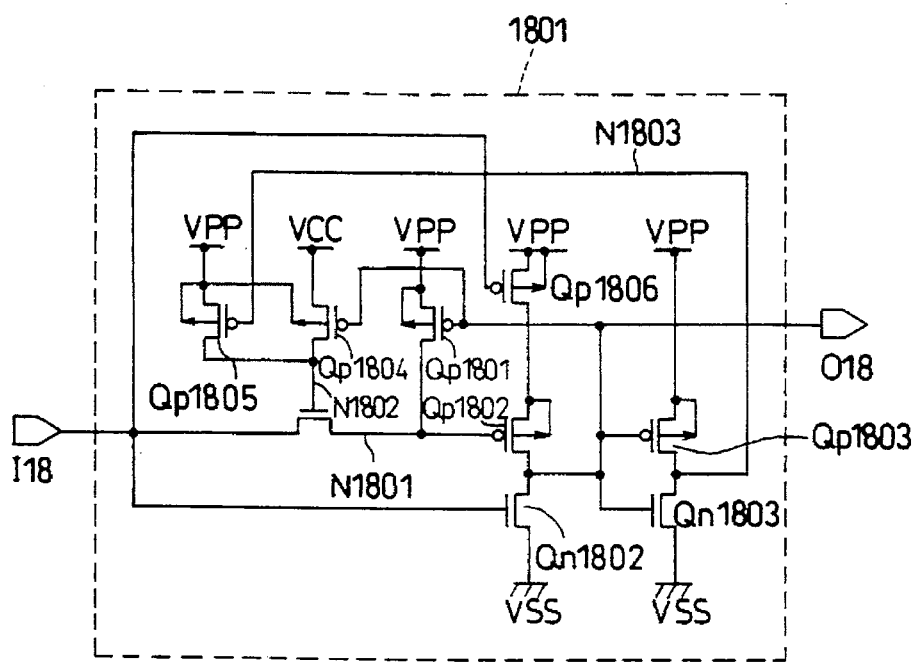
FIG. 18 shows a structure of a tenth embodiment of the voltage-level shifter of the invention.

FIG. 12 shows a circuit structure, and FIG. 18 shows an operation timing. I12 indicates an input signal, O12 indicates an output signal, VCC indicates the first voltage source, VPP indicates the second voltage source, and VSS indicates the ground voltage source. 1201 indicates a voltage-level shifter, Qn1201 and Qn1202 indicate N-channel MOS transistors, Qn1203 indicates an N-channel MOS transistor (fifth N-channel MOS transistor), Qn1204 indicates an N-channel MOS transistor (sixth N-channel MOS transistor (third N-channel MOS switch element)), Qp1201 and Qp1202 indicate P-channel MOS transistors, Qp1203 indicates a P-channel MOS transistor (sixth P-channel MOS transistor), and N1201–N1203 indicate node names.

The circuit structure in FIG. 12 will be described below. In the voltage-level shifter1201, the input signal I12 is connected to a source of the N-channel MOS transistor Qn1201, a source of the N-channel MOS transistor Qn1204 and a gate of the N-channel MOS transistor Qn1202. Sources of the N-channel MOS transistors Qn1202 and Qn1203 are connected to the ground voltage source VSS. Sources of the P-channel MOS transistors Qp1201 and Qp1202 are connected to the second voltage source VPP. Sources of the P-channel MOS transistor Qp1203 and Qp1204 are connected to the first voltage source VCC.

The node 1201 is connected to a drain of the N-channel MOS transistor Qn1201, a drain of the N-channel MOS transistor Qn1204, a drain the P-channel MOS transistor Qp1201 and a gate of he P-channel MOS transistor Qp1202. The output signal O12 is connected to a drain of the N-channel MOS transistor Qn1202, a gate of the P-channel MOS transistor Qp1201, a drain of the P-channel MOS transistor Qp1202, a gate of the P-channel MOS transistor Qp1203 and a gate of the N-channel MOS transistor Qn1203. The node N1203 is connected to a drain of the P-channel MOS transistor Qp1203, a drain of the N-channel MOS transistor Qn1203 and a gate of the N-channel MOS transistor Qn1204.

The fifth and sixth N-channel MOS transistors Qn1203 and Qn1204 as well as the sixth P-channel MOS transistorQp1203 form a potential control circuit (electric charge supply circuit) 120.

Figure 13:
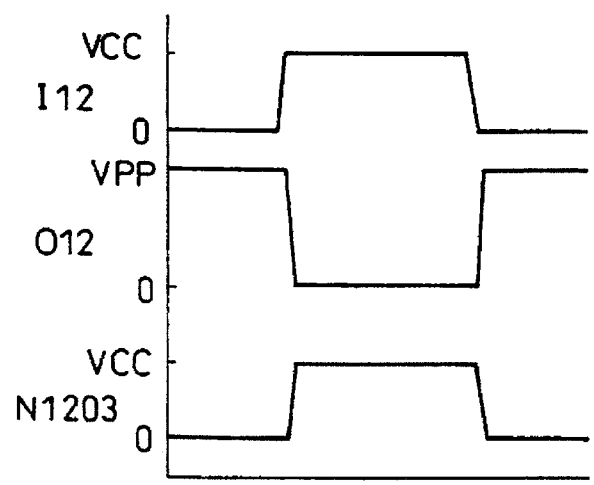
FIG. 13 shows an operation timing of the sixth embodiment of the voltage-level shifter of the invention.

An operation will be described below with reference to the operation timing diagram of FIG. 13. When the input signal I12 is at the "L" level, the node N1201 is at the "L" level, the N-channel MOS transistor Qn1202 is off, and the P-channel MOS transistor Qp1202 is on. At this time, the output signal O12 is at the potential of the second voltage source VPP and thus at the "H" level. At this time, the N-channel MOS transistor Qn1203 is on, the P-channel MOS transistor Qp1203 is off, and the node N1203 is at the "L" level. The N-channel MOS transistor Qn1201 is on, the N-channel MOS transistor Qn1204 is off, and the P-channel MOS transistor Qp1201 is off.

When the input signal I12 transits from the "L" level to the "H" level, the node N1201 initially attains lower one between the potential of (VCC-Vtn) and the potential of the first voltage source VCC, because the output signal O12 is at the potential of the first voltage source VCC. Assuming that VPP is 3.0 V, VCC is 1.5 V and Vtn is 0.7 V, the node N1201 attains the potential of the first voltage source VCC, i.e., 1.5 V.

Thereafter, the N-channel MOS transistor Qn1202 is turned on, and the P-channel MOS transistor Qp1202 is substantially turned off. The output signal O12 attains the "L" level, the N-channel MOS transistor Qn1203 is turned off, the P-channel MOS transistor Qp1203 is turned on, and the node 1203 is set to the potential of the first voltage source VCC. The N-channel MOS transistor Qn1201 is turned off, the N-channel MOS transistor Qn1204 is turned on, and the P-channel MOS transistor Qp1201 is turned on, so that the node N1201 is set to the potential of the second voltage source VPP, and the P-channel MOS transistor Qp1202 is completely turned off.

The foregoing voltage-level shifter has such a feature that, when the input signal I12 transits from the "L" level to the "H" level, the potential of the node N1201 is set to that of the first voltage source VCC, whereby the P-channel MOS transistor Qp1202 is substantially turned off. Thereby, it is possible to suppress a through current flowing from the second voltage source VPP to the ground voltage source VSS via the N-channel MOS transistor Qn1202 and the P-channel MOS transistor Qp1202. Also, the voltage level of the output signal O12 can be rapidly fixed at the "L" level. In particular, even when the first voltage source VCC supplies a low voltage, and/or there is a large potential difference between the first and second voltage sources VCC and VPP, the voltage level of the output signal O12 can be rapidly fixed at the "L" level.

[Seventh Embodiment]

A voltage-level shifter of a seventh embodiment of the invention will now be described below.

Figure 14:
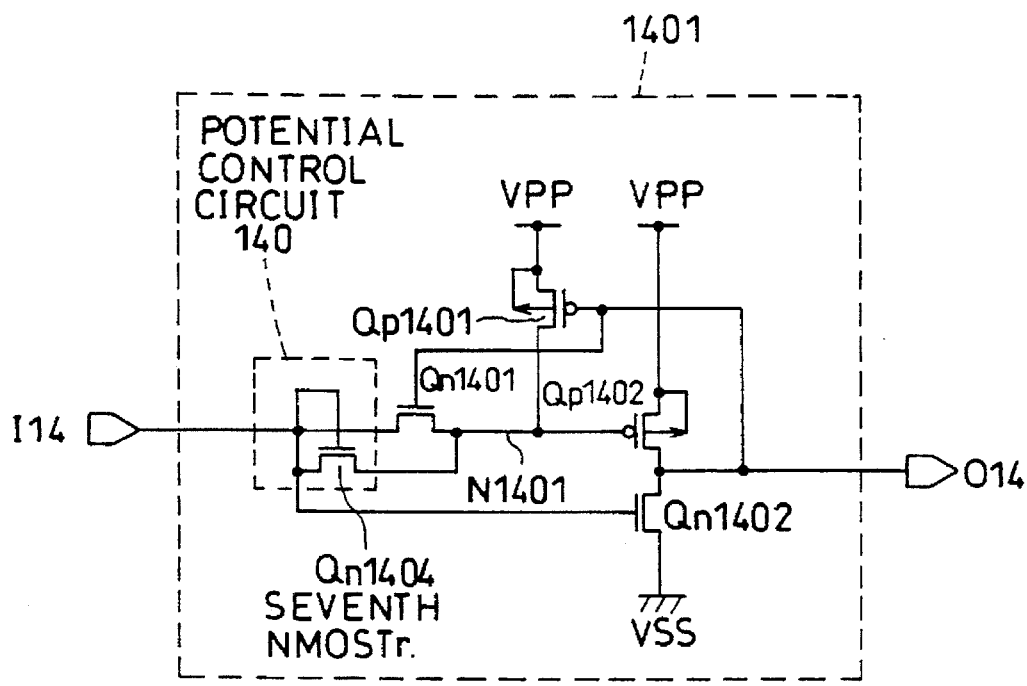
FIG. 14 shows a structure of a seventh embodiment of the voltage-level shifter of the invention.
Figure 15:
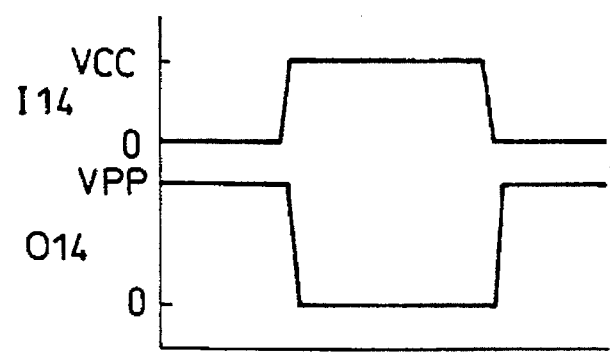
FIG. 15 shows an operation timing of the seventh embodiment of the voltage-level shifter of the invention.

FIG. 14 shows a circuit structure, and FIG. 15 shows an operation timing. I14 indicates an input signal, O14 indicates an output signal, VCC indicates the first voltage source, VPP indicates the second voltage source, and VSS indicates the ground voltage source. 1401 indicates a voltage-level shifter, Qn1401 and Qn1402 indicate N-channel MOS transistors, Qn1404 indicates an N-channel MOS transistor (seventh N-channel MOS transistor), Qp1401 and Qp1402 indicate P-channel MOS transistors, and N1401 indicates a node name.

The circuit structure in FIG. 14 will be described below. In the voltage-level shifter1401, the input signal I14 is connected to a source of the N-channel MOS transistor Qn1401, a source of the N-channel MOS transistor Qn1404n a gate of the N-channel MOS transistor Qn1404 and a gate of the N-channel MOS transistor Qn1402. A source of the N-channel MOS transistor Qn1402 is connected to the ground voltage source VSS. Sources of the P-channel MOS transistors Qp1401 and Qp1402 are connected to the second voltage source VPP.

The node 1401 is connected to a drain of the N-channel MOS transistor Qn1401, a drain of the N-channel MOS transistor Qn1404, a drain the P-channel MOS transistor Qp1401 and a gate of the P-channel MOS transistor Qp1402. The output signal O14 is connected to a drain of the P-channel MOS transistor Qp1402, a gate of the P-channel MOS transistor Qp1401, a drain of the P-channel MOS transistor Qp1402 and a gate of the N-channel MOS transistor Qn1401.

The seventh N-channel MOS transistors Qn1404 forms a potential control circuit (electric charge supply circuit) 140.

An operation will be described below with reference to the operation timing diagram of FIG. 15. When the input signal I14 is at the "L" level, the node N1401 is at the "L" level, the N-channel MOS transistor Qn1402 is off, the N-channel MOS transistor Qn1404 is off and the P-channel MOS transistor Qp1402 is on. The output signal O14 is at the potential of the second voltage source VPP and thus at the "H" level. The P-channel MOS transistor Qp1401 is off, and the N-channel MOS transistor Qn1401 is on. When the input signal I14 transits thereafter from the "L" level to the "H" level, the N-channel MOS transistor Qn1402 is turned on, and the node N1401 initially attains lower one between the potential of (VPP–Vtn) and the potential of the first voltage source VCC, because the output signal O14 is initially at the potential of the second voltage source VPP. Assuming that VPP is 3.0 V, VCC is 1.5 V and Vtn is 0.7 V, the node N1401 attains the potential of the first voltage source VCC of 1.5 V.

Thereafter, the P-channel MOS transistor Qp1402 is substantially turned off, and the output signal O14 attains the "L" level. Further, the P-channel MOS transistor Qp1401 is turned on, the N-channel MOS transistor Qn1401 is turned off, the node N1401 attains the potential of the second voltage source VPP, and the P-channel MOS transistor Qp1402 is completely turned off.

The foregoing voltage-level shifter has such a feature that, when the input signal I14 transits from the "L" level to the "H" level, the node N1401 is set to the potential of the first voltage source VCC, whereby the P-channel MOS transistor Qp1402 is substantially turned off. Thereby, it is possible to suppress a through current flowing from the second voltage source VPP to the ground voltage source VSS via the N-channel MOS transistor Qn1402 and the P-channel MOS transistor Qp1402. Also, the voltage level of the output signal O14 can be rapidly fixed at the "L" level. In particular, even when the first voltage source VCC supplies a low voltage, and/or there is a large potential difference between the first and second voltage sources VCC and VPP, the voltage level of the output signal O14 can be rapidly fixed at the "L" level.

[Eighth Embodiment]

A voltage-level shifter of an eighth embodiment of the invention will now be described below.

Figure 16:
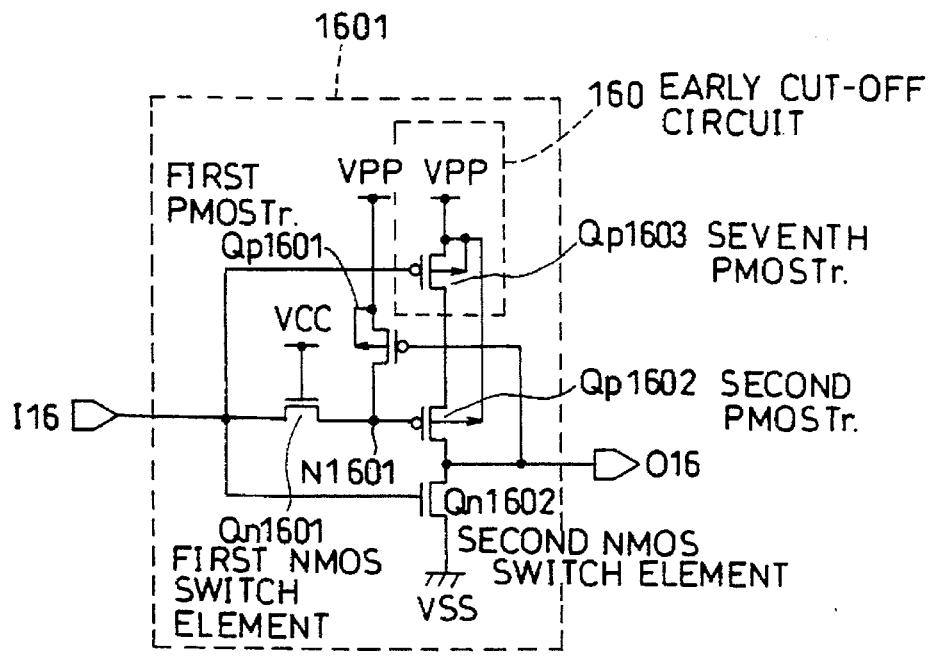
FIG. 16 shows a structure of an eighth embodiment of the voltage-level shifter of the invention.

FIG. 16 shows a circuit structure. In FIG. 16, I16 indicates an input signal, O16 indicates an output signal, VCC indicates the first voltage source, VPP indicates the second voltage source, and VSS indicates the ground voltage source. 1601 indicates a voltage-level shifter, Qn1601 indicates an N-channel MOS transistor (first N-channel MOS switch element) and Qn1602 indicates an N-channel MOS transistor (second N-channel MOS switch element). Qp1601 indicates a P-channel MOS transistor (first P-channel MOS transistor) and Qp1602 indicates a P-channel MOS transistor (second P-channel MOS transistor). Qp1603c indicates a P-channel MOS transistor (seventh P-channel MOS transistor). N1601 indicates a node name.

The circuit structure in FIG. 16 will be described below. In the voltage-level shifter1601, the input signal I16 is connected to a source of the N-channel MOS transistor Qn1601, a gate of the N-channel MOS transistor Qn1602 and a gate of the P-channel MOS transistor Qp1603. A gate of the N-channel MOS transistor Qn1601 is connected to the first voltage source VCC. A source of the N-channel MOS transistor Qn1602 is connected to the ground voltage source VSS. The node 1601 is connected to a drain of the N-channel MOS transistor Qn1601, a drain of the P-channel MOS transistor Qp1601 and a gate of the P-channel MOS transistor Qp1602.

A source of the P-channel MOS transistor Qp1601 and a source of the P-channel MOS transistor Qp1603 are connected to the second voltage source VPP. A drain of the P-channel MOS transistor Qp1603 is connected to a source of the P-channel MOS transistor Qp1602. Further, the output signal O16 is connected to a drain of the N-channel MOS transistor Qn1602, a gate of the P-channel MOS transistor Qp1601 and a drain of the P-channel MOS transistor Qp1602.

Owing to the connection structure of the N-channel MOS transistor Qn1601, as already described, the circuit serves also as a signal inverter circuit for inverting the input signal I16.

Further, owing to provision of the seventh P-channel MOS transistor Qp1603, an early cut-off circuit 160 is formed.

The voltage-level shifter in FIG. 16 has such a feature that the P-channel MOS transistor Qp1603 is connected between the source of the P-channel MOS transistor Qp1602 and the second voltage source VPP, and the gate of the P-channel MOS transistor Qp1603 receives the input signal I16, so that, when the input signal I16 is at the potential of the first voltage source VCC, the node N1601 is at the potential of (VCC–Vtn), the P-channel MOS transistor Qp1603 attains the off state to a higher extent than the off state of the P-channel MOS transistor Qp1602, and the voltage level of the output signal O16 can be rapidly fixed at the "L" level. For example, if VCC is 3 V and VPP is 12 V, a time required for the fixing is reduced substantially by half. Owing to the rapid fixing of the voltage level, the current consumption can be reduced.

[Ninth Embodiment]

A voltage-level shifter of a ninth embodiment of the invention will now be described below.

Figure 17:
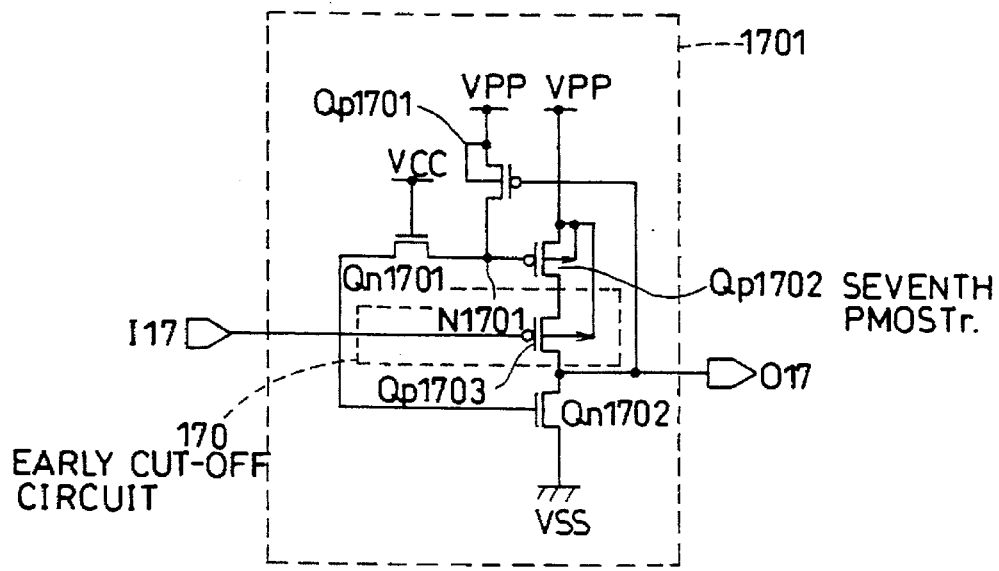
FIG. 17 shows a structure of a ninth embodiment of the voltage-level shifter of the invention.

FIG. 17 shows a circuit structure. I17 indicates an input signal, O17 indicates an output signal, VCC indicates the first voltage source, VPP indicates the second voltage source, and VSS indicates the ground voltage source. 1701 indicates a voltage-level shifter, Qn1701 and Qn1702 indicate N-channel MOS transistors. Qp1701 and Qp1702 indicate P-channel MOS transistors, Qp1703 indicates a P-channel MOS transistor (seventh P-channel MOS transistor), and N1701 indicates a node name.

The circuit structure in FIG. 17 will be described below. In the voltage-level shifter1701, the input signal I17 is connected to a source of the N-channel MOS transistor Qn1701, a gate of the N-channel MOS transistor Qn1702 and a gate of the P-channel MOS transistor Qp1703. A gate of the N-channel MOS transistor Qn1701 is connected to the first voltage source VCC. A source of the N-channel MOS transistor Qn1702 is connected to the ground voltage source VSS. The node 1701 is connected to a drain of the N-channel MOS transistor Qn1701, a drain of the P-channel MOS transistor Qp1701 and a gate of the P-channel MOS transistor Qp1702.

A source of the P-channel MOS transistor Qp1701 and a source of the P-channel MOS transistor Qp1702 are connected to the second voltage source VPP. A drain of the P-channel MOS transistor Qp1702 is connected to a source of the P-channel MOS transistor Qp1703. Further, the output signal O17 is connected to a drain of the N-channel MOS transistor Qn1702, a gate of the P-channel MOS transistor Qp1701 and a drain of the P-channel MOS transistor Qp1703.

Owing to provision of the seventh P-channel MOS transistor Qp1703, an early cut-off circuit 170 is formed.

The voltage-level shifter1701 In FIG. 17 has a feature similar to that of the eighth embodiment, and more specifically has such a feature that the P-channel MOS transistor Qp1702 is connected between the source of the P-channel MOS transistor Qp1703 and the second voltage source VPP, and the gate of the P-channel MOS transistor Qp1703 receives the input signal I17, so that, when the input signal I17 is at the potential of the first voltage source VCC, and the node N1701 is at the potential of (VCC−Vtn), the P-channel MOS transistor Qp1703 is set to the off state to a higher extent than the off state of the P-channel MOS transistor Qp1702. Thereby, the voltage level of the output signal O17 can be rapidly fixed at the "L" level.

In the eighth and ninth embodiments, the third P-channel MOS transistors Qp1601 and Qp1703 are connected in serial to the second P-channel MOS transistors Qp1602 and Qp1702, respectively. Alternatively, although not shown, the third P-channel MOS transistors Qp1603 and Qp1703 may be connected in serial to the first P-channel MOS transistors Qp1601 and Qp1701, respectively, in which case a similar effect can also be achieved.

[Tenth Embodiment]

A voltage-level shifter of a tenth embodiment of the invention will now be described below. The tenth embodiment corresponds to composition of the fifth and eighth embodiments.

FIG. 18 shows a circuit structure. I18 indicates an input signal, O18 indicates an output signal, VCC indicates the first voltage source, VPP indicates the second voltage source, and VSS indicates the ground voltage source. 1801 indicates a voltage-level shifter, Qn1801–Qn1803 indicate N-channel MOS transistors, and Qp1801–Qp1806 indicate P-channel MOS transistors. N1801–N1803 indicate node names.

The circuit structure in FIG. 18 will be described below. In the voltage-level shifter1801, the input signal I18 is connected to a source of the N-channel MOS transistor Qn1801, a gate of the N-channel MOS transistor Qn1802 and a gate of the P-channel MOS transistor Qp1806. The node N1802 is connected to a gate of the N-channel MOS transistor Qn1801, a drain of the P-channel MOS transistor Qp1804 and a drain of the P-channel MOS transistor Qp1805. A source of the N-channel MOS transistor Qn1802 is connected to the ground voltage source VSS, and sources of the P-channel MOS transistors Qp1801, Qp1803, Qp1805 and Qp1806 are connected to the second voltage source VPP.

A source of the P-channel MOS transistor Qp1804 is connected to the first voltage source VCC, and the node N1801 is connected to a drain of the N-channel MOS transistor Qn1801, a drain of the P-channel MOS transistor Qp1801 and a gate of the P-channel MOS transistor Qp1802. A source of the P-channel MOS transistor Qp1802 and a drain of the P-channel MOS transistor Qp1806 are connected together. The output signal O18 is connected to a drain of the N-channel MOS transistor Qn1802, a gate of the P-channel MOS transistor Qp1801, a gate of the P-channel MOS transistor Qp1804, a drain of the P-channel MOS transistor Qp1802, a gate of the P-channel MOS transistor Qp1803 and a gate of the N-channel MOS transistor Qn1803. The node1803 is connected to a drain of the P-channel MOS transistor Qp1803, a drain of the N-channel MOS transistor Qn1803 and gate of the P-channel MOS transistor Qp1805. A source of the N-channel MOS transistor Qn1803 is connected to the ground voltage source VSS.

In addition to the features of the embodiments 5 and 8, the voltage-level shifter1801 of this embodiment has such a feature that the voltage level of the output signal O18 can be fixed further rapidly at the "L" level when the input signal I18 transits from the "L" level to the "H" level.

[Eleventh Embodiment]

A voltage-level shifter of an eleventh embodiment of the invention will now be described below. The eleventh embodiment corresponds to composition of the seventh and ninth embodiments.

Figure 19:
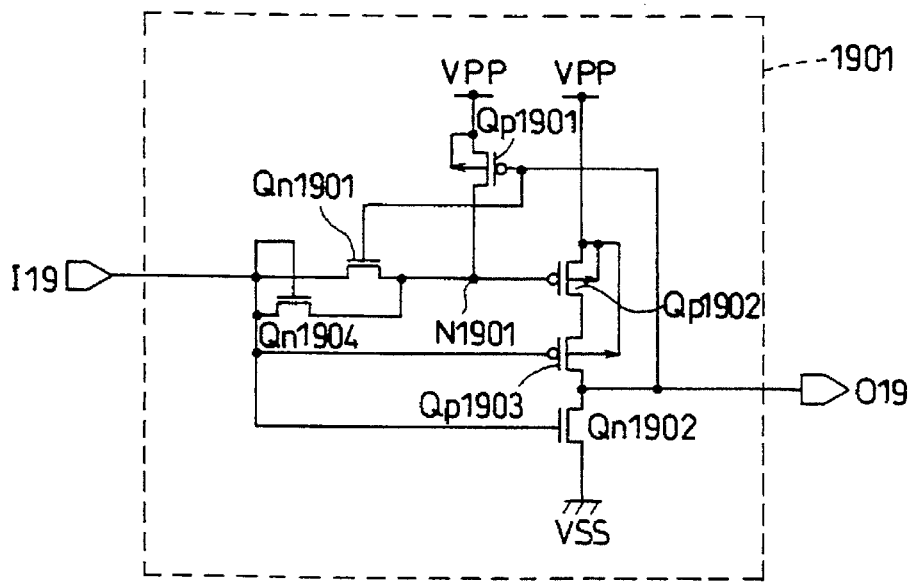
FIG. 19 shows a structure of an eleventh embodiment of the voltage-level shifter of the invention.

FIG. 19 shows a circuit structure. I19 indicates an input signal, O19 indicates an output signal, VCC indicates the first voltage source, VPP indicates the second voltage source, and VSS indicates the ground voltage source. 1901 indicates a voltage-level shifter, Qn1901, Qn1902 and Qn1904 indicate N-channel MOS transistors. Qp1901–Qp1903 indicate P-channel MOS transistors. N1901 indicates a node name.

The circuit structure in FIG. 19 will be described below. In the voltage-level shifter1901, the input signal I19 is connected to a source of the N-channel MOS transistor Qn1901, a source of the N-channel MOS transistor Qn1904, a gate of the N-channel MOS transistor Qn1904, a gate of the N-channel MOS transistor Qn1902 and a gate of the P-channel MOS transistor Qp1903 A source of the N-channel MOS transistor Qn1902 is connected to the ground voltage source VSS. A source of the P-channel MOS transistor Qp1901 and a source of the P-channel MOS transistor1902 are connected to the second voltage source VPP.

The node N1901 is connected to a drain of the N-channel MOS Transistor Qn1901, a drain of the N-channel MOS transistor Qn1904, a drain of the P-channel MOS transistor Qp1901 and a gate of The P-channel MOS transistor Qp1902. A drain of the P-channel MOS transistor Qp1902 and a source of the P-channel MOS transistor Qp1903 are connected together. The output signal O19 is connected to a drain of the N-channel MOS transistor Qn1902, a gate of the P-channel MOS transistor Qp1901, a drain of the P-channel MOS transistor Qp1903 and a gate of the N-channel MOS transistor Qn1901.

In addition to the feature of the embodiments b 5and 8, the voltage-level shifter1901 of this embodiment has such a feature that the voltage level of the output signal O19 can be fixed further rapidly at the "L" level when the input signal I19 transits from the "L" level to the "H" level.

[Twelfth Embodiment]

A voltage-level shifter of a twelfth embodiment of the invention will now be described below. The twelfth embodiment is formed of a plurality of voltage-level shifter units.

Figure 20:
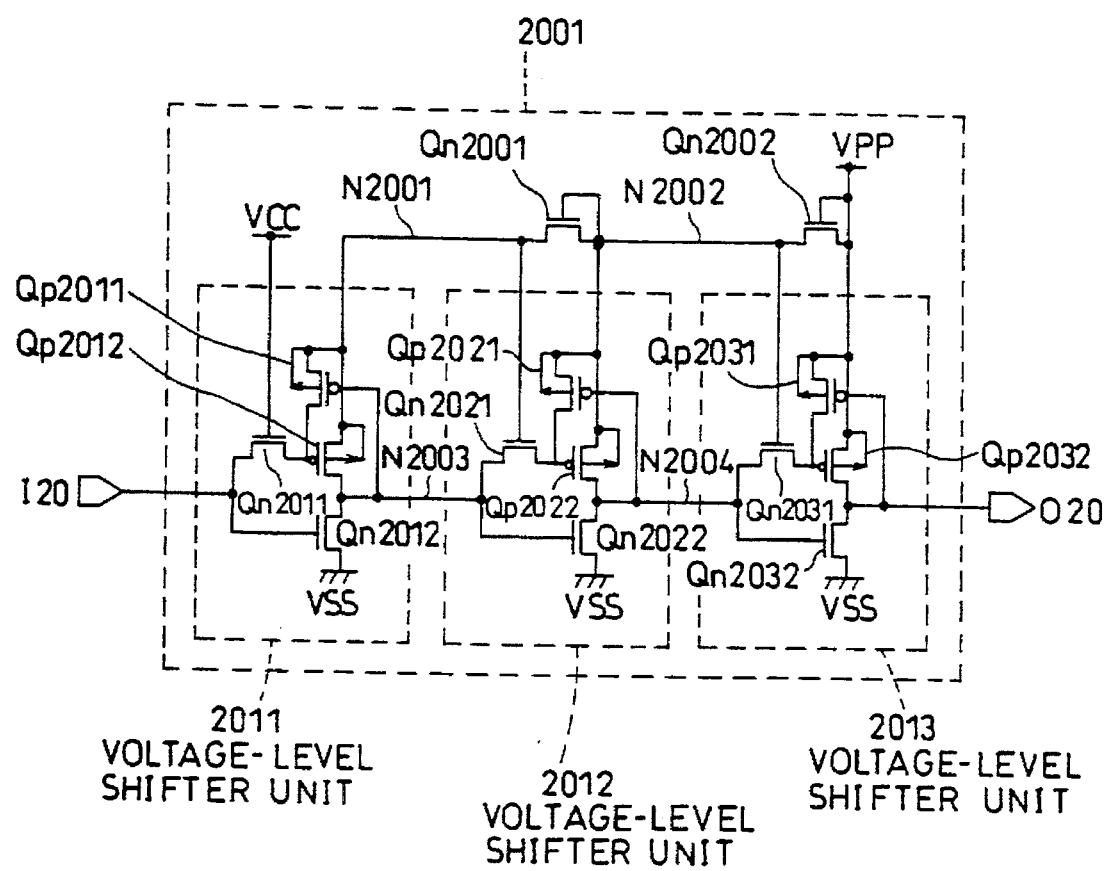
FIG. 20 shows a structure of a twelfth embodiment of the voltage-level shifter of the invention.

FIG. 20 shows a circuit structure. I20 indicates an input signal, O20 indicates an output signal, VCC indicates the first voltage source, VPP indicates the second voltage source, and VSS indicates the ground voltage source. 2011–2013 indicate voltage-level shifter units. 2001 indicates a voltage-level shifter formed of the voltage-level shifter units 2011–2013. Qn2001–Qn2032 indicate N-channel MOS transistors. Qp2011–Qp2032 indicate P-channel MOS transistors. N2001–N2004 indicate node names.

The circuit structure in FIG. 20 will be described below. The voltage-level shifter 2001 is formed of the voltage-level shifter units 2011–2013 and the two N-channel MOS transistors Qn2001 and Qn2002. The voltage-level shifter unit 2011 shifts the potential of the first voltage source VCC of the input signal to the voltage level potential (VPP−2×Vtn) of the node N2001, the voltage-level shifter unit 2012 shifts the voltage level (VPP−2×Vtn) of the node N2001 to the voltage level (VPP−Vtn) of the node N2002, and the voltage-level shifter unit 2013 shifts the voltage level (VPP−Vtn) of the node N2001 to the second voltage source VPP of the output signal. Each of the voltage-level shifters 2011–2013 shown in the figure is the same as that in the prior art shown in FIG. 30.

The node N2002 is a drain of the N-channel MOS transistor Qn2002 of which gate and source are connected to the second voltage source VPP. The node N2001 is a drain of the N-channel MOS transistor Qn2001 of which gate and source are connected to the node N2002. In this embodiment, the voltage-level shifter units 2011–2013 are formed of the conventional structures shown in FIG. 22. Alternatively, they can be formed of any of the voltage-level shifters of the first to eleventh embodiments already described.

The voltage-level shifter of this embodiment has such a feature that since the multiple voltage-level shifter units are used to shift the first voltage source VCC of the input signal to the potential of the second voltage source VPP of the output signal through multiple voltage levels, the voltage level of the output signal can be surely fixed even if there is a large potential difference between the first and second voltage sources VCC and VPP.

[Thirteenth Embodiment]

A thirteenth embodiment of a voltage-level shifter of the invention will be described below. This thirteenth embodiment is formed of a plurality of voltage-level shifter units.

Figure 21:
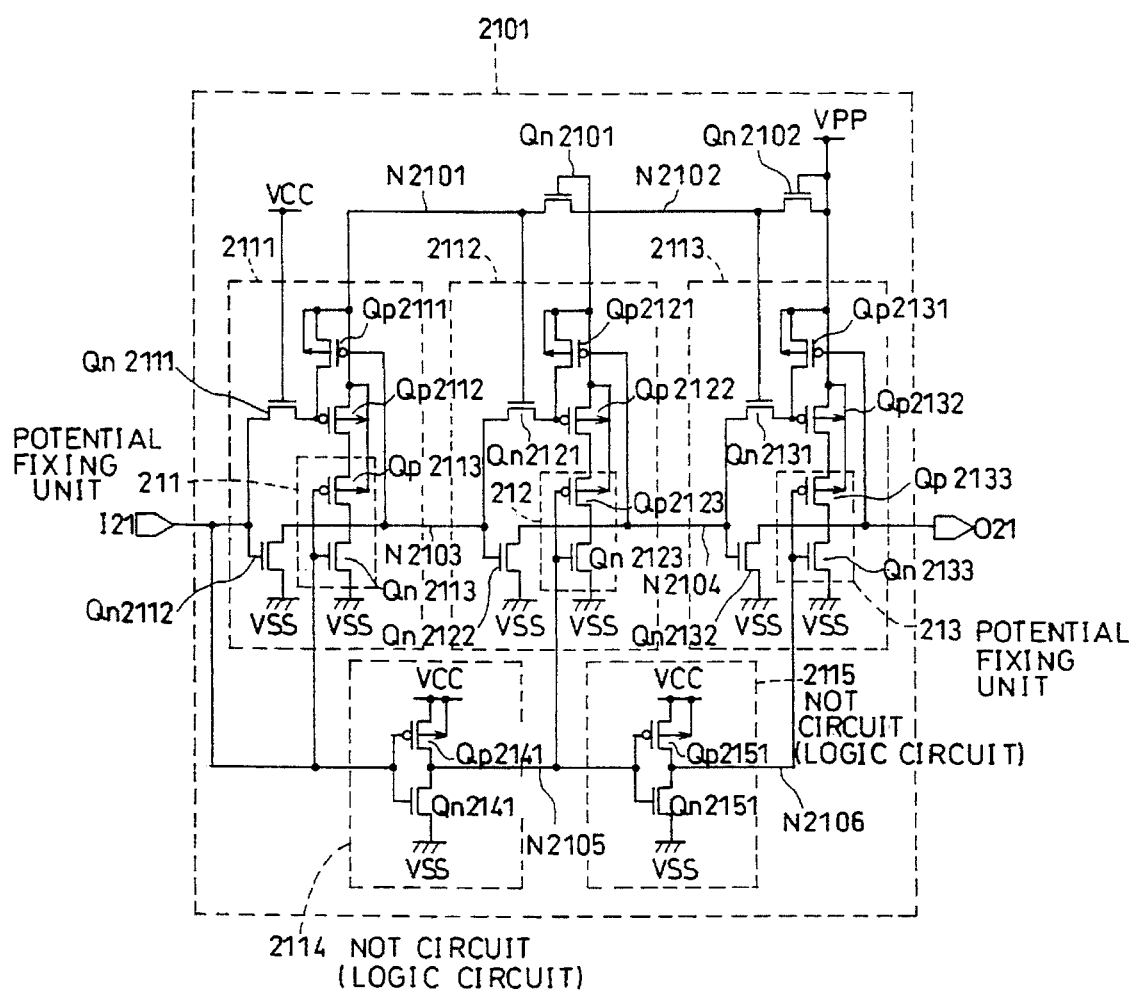
FIG. 21 shows a structure of a thirteenth embodiment of the voltage-level shifter of the invention.

FIG. 21 shows a circuit structure. In the figure, I21 indicates an input signal, O21 indicates an output signal, VCC indicates the first voltage source, VPP indicates the second voltage source, and VSS indicates the ground voltage source. 2111–2113 indicate voltage-level shifter units, 2114 and 2115 indicate NOT circuits (logical circuits), 2101 indicates a voltage-level shifter, Qn2101–Qn2151 indicate N-channel MOS transistors, Qp2111–Qp2151 indicate P-channel MOS transistors, and N2101–N2106 indicate node names. In the voltage level converter unit 2111, the P-channel MOS transistor Qp2113 and the N-channel MOS transistor Qn2113 form a potential fixing unit 211. In the voltage level converter unit 2112, the P-channel MOS transistor Qp2123 and the N-channel MOS transistor Qn2123 form a potential fixing unit 212. In the voltage level converter unit 2113, the P-channel MOS transistor Qp2133 and the N-channel MOS transistor Qn2133 form a potential fixing unit 213.

The circuit structure in FIG. 21 will be described below. The voltage-level shifter 2101 is formed of the voltage-level shifter units 2111–2113, the NOT circuits 2114 and 2115 and the MOS transistors. The voltage-level shifter unit 2111 shifts the potential of the first voltage source VCC of the input signal to the voltage level (VPP−2×Vtn) of the node N2101, the voltage-level shifter unit 2112 shifts the voltage level (VPP−2×Vtn) of the node N2101 to the voltage level (VPP−Vtn) of the node N2102, and the voltage-level shifter unit 2113 shifts the voltage level (VPP−Vtn) of the node N2101 to the second voltage source VPP of the output signal.

The circuit structure of the voltage-level shifter units 2111–2113 shown in the figure will now be described below. Since all the voltage-level shifter units 2111–2113 have the same circuit structure, the following description will be given on only the voltage-level shifter unit 2113. The node 2104 supplying the first input signal is connected to a source of the N-channel MOS transistor Qn2131 and a gate of the N-channel MOS transistor Qn2132. A gate of the N-channel MOS transistor Qn2131 is connected to the node 2102 at the voltage level of the first input signal. The node 2106 supplying the second input signal is connected to a gate of the N-channel MOS transistor Qn2133 and a gate of the P-channel MOS transistor Qp2133.

A drain of the N-channel MOS transistor Qn2131, a gate of the P-channel MOS transistor Qp2132 and a drain of the P-channel MOS transistor Qp2131 are connected together, and a drain of the P-channel MOS transistor Qp2132 and a source of the P-channel MOS transistor Qp2133 are connected together. The output signal O21 is connected to a drain of the N-channel MOS transistor Qn2133, a drain of the P-channel MOS transistor Qp2133 and a gate of the P-channel MOS transistor Qp2131.

A source of the N-channel MOS transistor Qn2132 and a source of the N-channel MOS transistor Qn2133 are connected to the ground voltage source VSS. A source of the P-channel MOS transistor Qp2131 and a source of the P-channel MOS transistor Qp2132 are connected to the second voltage source VPP, i.e., the voltage level of the output signal. The NOT circuits 2114 and 2115 use the first voltage source VCC as their voltage sources.

A structure of the voltage-level shifter 2101 will be described below.

The node N2102 is a drain of the N-channel MOS transistor Qn2102 of which gate and source are connected to the second voltage source VPP. The node N2101 is a drain of the N-channel MOS transistor Qn2101 of which gate and source are connected to the node N2102.

In the voltage-level shifter unit 2111, the input signal I21 is connected for supplying the first and second input signals. A gate of the N-channel MOS transistor Qn2111 is connected to the first voltage source VCC at the voltage level of the input signal. Sources of the P-channel MOS transistors Qp2111 and Qp2112 are connected to the node N2101 at the voltage level of the output signal, and the potential of the node N2103 is output as the output signal. In the NOT circuit 2114, the input signal I21 is connected to supply the input signal, and the potential of the node 2105 is outputted as the output signal. The voltage-level shifter unit 2112 is connected to the input signal I21 for receiving the first input signal and is also connected to receive the potential of the node N2105 as the second input signal.

A gate of the N-channel MOS transistor Qn2121 is connected to the node 2101 at the potential of the voltage level of the first input signal. Sources of the P-channel MOS transistors Qp2121 and Qp2122 are connected to the node 2102 at the voltage level of the output signal, and the potential of the node 2104 is outputted as the output signal. The NOT circuit 2115 is connected to receive the potential of the node N2105 as the input signal, and is also connected to output the potential of the node N2106 as the output signal. In the voltage-level shifter unit 2113, the node N2104 is connected for receiving the first input signal, the node N2106 is connected for receiving the second input signal, and a gate of the N-channel MOS transistor Qn2131 is connected to the node 2102 at the voltage level of the first input signal.

Sources of the P-channel MOS transistors Qp2131 and Qp2132 are connected to the second voltage source VPP at the voltage level of the output signal. Further, the output signal O21 is outputted. Instead of the above circuit structure, the voltage level shifter units 211–2113 in this embodiment may be formed of appropriate composition of the voltage-level shifters of the first to eleventh embodiments of the invention.

The voltage-level shifter of this embodiment has such a feature that, similarly to the twelfth embodiment, since the multiple voltage-level shifter units are used to shift the first voltage source VCC of the input signal to the potential of the second voltage source VPP of the output signal forming the output signal through multiple voltage levels, the voltage level of the output signal can be surely fixed even if there is a large potential difference between the first and second voltage sources VCC and VPP.

For example, even if the voltage level of the voltage level shifter unit 2111, i.e., the voltage level of the output signal of the node N2101 is low, and the potential of the node N2103 forming the output signal, i.e., the voltage level at the "H" level is insufficient, the signal at the voltage level of the first voltage source VCC is inputted as the second input signal to the voltage-level shifter unit 2112, whereby the voltage-level shifter 2112 can be surely operated, and the voltage level of the output signal of the voltage level shifter 2101 can be fixed.

[Fourteenth Embodiment]

A fourteenth embodiment of a voltage-level shifter of the invention will be described below.

Figure 22:
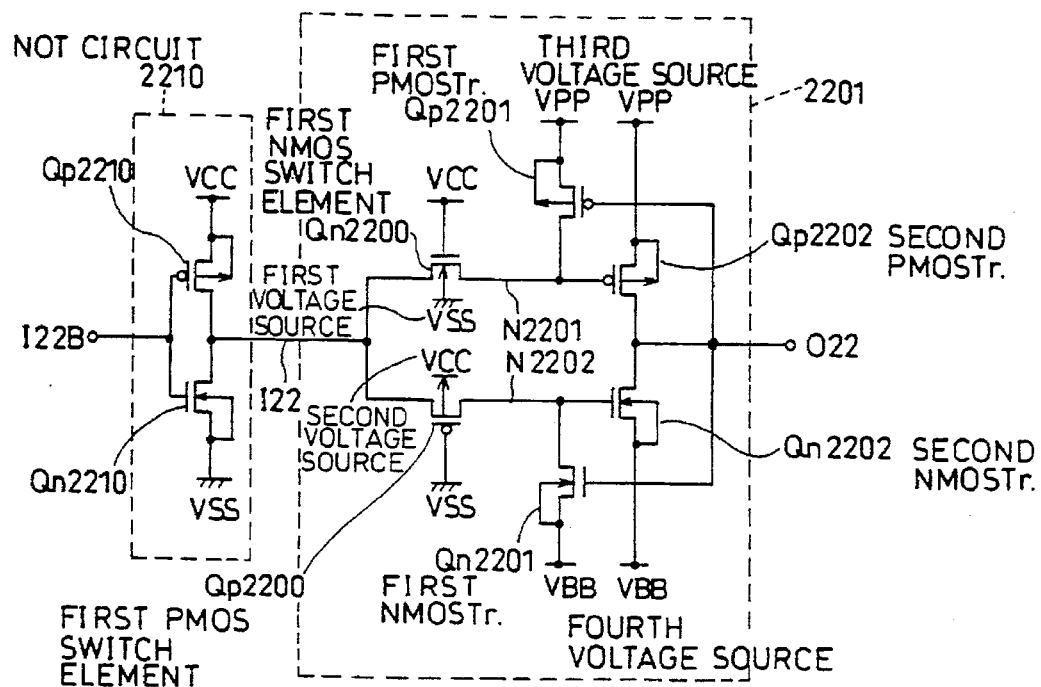
FIG. 22 shows a structure of a fourteenth embodiment of the voltage-level shifter of the invention.

FIG. 22 shows a circuit structure. In the figure, 2210 indicates a NOT circuit, 2201 indicates a voltage-level shifter, I22B indicates an input signal of the NOT circuit 2210, I22 indicates an input signal of the voltage-level shifter 2201, O22 indicates an output signal, VCC indicates a second voltage source, VPP indicates a third voltage source, VSS indicates the ground voltage source (first voltage source), and VBB indicates a fourth voltage source. Qn2200 indicates an N-channel MOS transistor (first N-channel MOS switch element), Qn2201 indicates an N-channel MOS transistor (first N-channel MOS transistor), Qn2202 indicates an N-channel MOS transistor (second N-channel MOS transistor), and Qn2210 indicates an N-channel MOS transistor.

Qp2200 indicates a P-channel MOS transistor (first P-channel MOS switch element), Qp2201 indicates a P-channel MOS transistor (first P-channel MOS transistor), Qp2202 indicates a P-channel MOS transistor (second P-chaƞnel MOS transistor), and Qp2210 indicates a P-channel MOS transistor. N2201 and N2202 indicate node names.

The structure of the voltage-level shifter in FIG. 22 will be described below.

The NOT circuit 2210 is formed of the N-channel MOS transistor Qn2210 and the P-channel MOS transistor Qp2210, which receive the signal I22B, output the signal I22 and use the ground voltage source VSS and the second voltage source VCC as their power sources, respectively.

In the voltage-level shifter 2201, the input signal I22 is connected to a source of the N-channel MOS transistor Qn2200 and a source of the P-channel MOS transistor Qp2200. The node N2201 is connected to a drain of the N-channel MOS transistor Qn2200, a drain of the P-channel MOS transistor Qp2201 and a gate of the P-channel MOS transistor Qp2202. The node N2202 is connected to a drain of the P-channel MOS transistor Qp2200, a drain of the N-channel MOS transistor Qn2201 and a gate of the N-channel MOS transistor Qn2202.

The output signal O22 is connected to a gate of the P-channel MOS transistor Qp2201, a drain of the P-channel MOS transistor Qp2202, a gate of the N-channel MOS transistor Qn2201 and a drain of the N-channel MOS transistor Qn2202. Sources of the P-channel MOS transistors Qp2201 and Qp2202 are connected to the third voltage source VPP. The sources of the N-channel MOS transistors Qn2201 and Qm2201 are connected to the fourth voltage source VBB.

Figure 23:
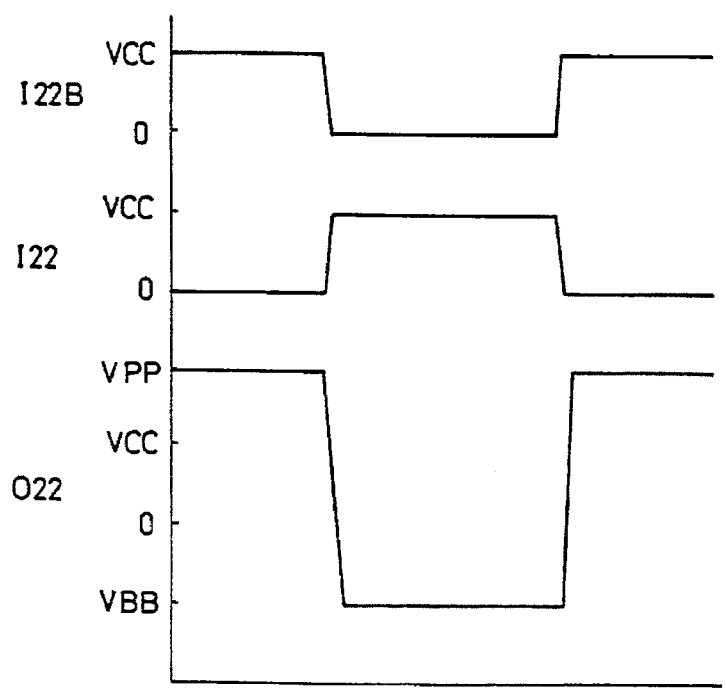
FIG. 23 shows an operation timing of the fourteenth embodiment of the voltage-level shifter of the invention.

A shown in an operation timing diagram of FIG. 23, the voltage-level shifter 2201 shifts the input signal of the amplitudes of the ground voltage source (first voltage source) VSS and the second voltage source VCC to the signal of the amplitudes of the third voltage source VPP and the fourth voltage source VBB.

This voltage-level shifter has such a feature that both the maximum and minimum values of the amplitude of the input signal are amplified to output the signal of a large amplitude with a small circuit structure including six MOS transistors in total.

Figure 24:
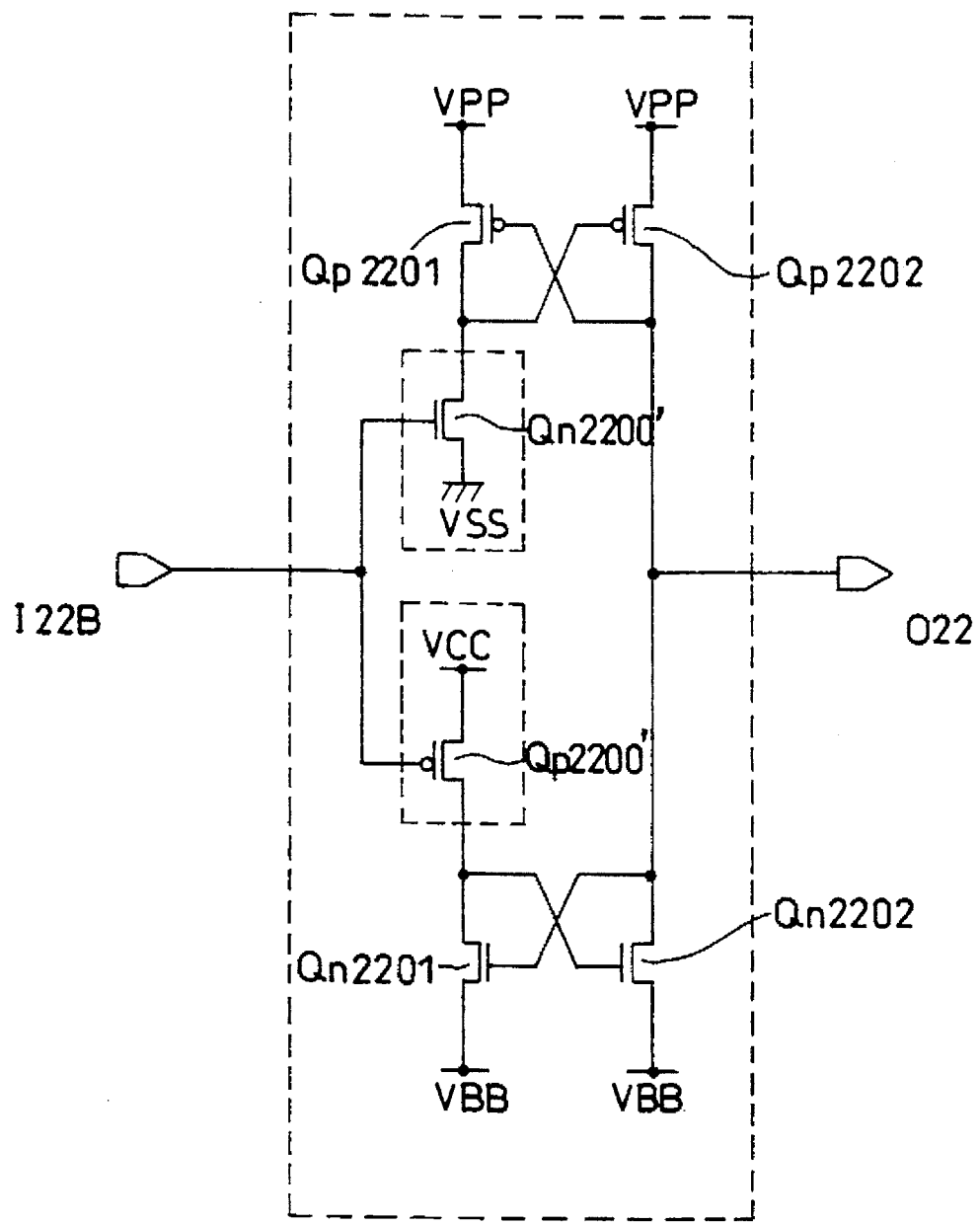
FIG. 24 shows a basic structure of the fourteenth embodiment of the voltage-level shifter of the invention.

The voltage-level shifter shown in FIG. 22 has a basic structure similar to the structure shown in FIG. 24. A difference between the basic structure in FIG. 24 and the structure in FIG. 22 is as follows. The basic structure in FIG. 24 does not have the NOT circuit 2210 in FIG. 22. In the basic structure in FIG. 24, the input signal is supplied to a gate of an N-channel MOS switch element Qn2200', which has a source connected to the ground voltage source VSS of the input signal and a drain connected to the P-channel MOS transistor Qp2202. In the basic structure in FIG. 24, the input signal is supplied to a gate of a P-channel MOS switch element Qp2200', which has a source connected to another voltage source VCC of the input signal and a drain connected to the N-channel MOS transistor Qn2202. The basic structure in FIG. 24 operates in the same manner as the structure in FIG. 22.

[Fifteenth Embodiment]

A fifteenth embodiment of a voltage-level shifter of the invention will be described below.

Figure 25:
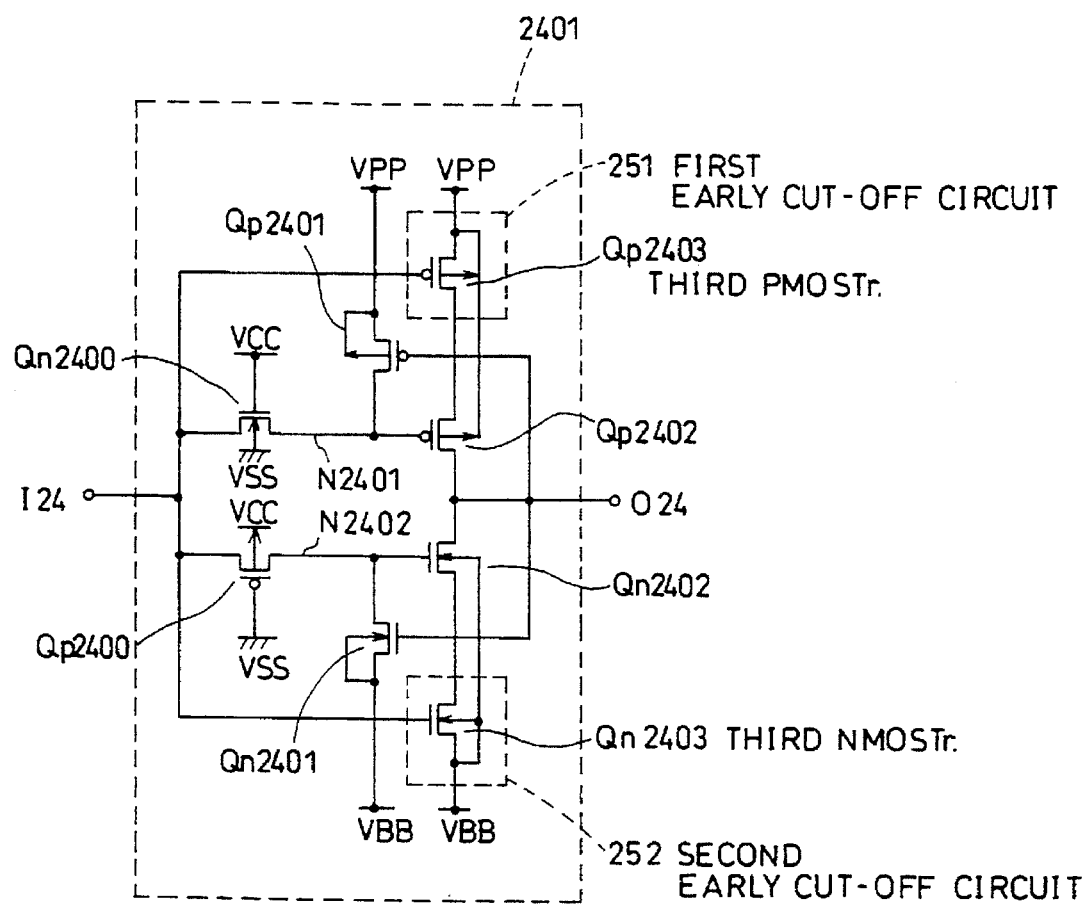
FIG. 25 shows a structure of a fifteenth embodiment of the voltage-level shifter of the invention.

FIG. 25 shows a circuit structure. This embodiment corresponds to composition of the fourteenth and eighth embodiments. 2401 indicates a voltage-level shifter, I24 indicates an input signal of the voltage-level shifter 2401, O24 indicates an output signal, VSS indicates the ground voltage source (first voltage source), VCC indicates the second voltage source, VPP indicates the third voltage source, and VBB indicates the fourth voltage source. Qn2400–Qn2402 indicate N-channel MOS transistors, Qn2403 indicates an N-channel MOS transistor (third N-channel MOS transistor), Qp2400–Qp2402 indicate P-channel MOS transistors, Qp2403 indicates a P-channel MOS transistor (third P-channel MOS transistor), and N2401 and N2402 indicate node names.

The circuit structure in FIG. 25 will be described below. In the voltage-level shifter 2401, the input signal I24 is connected to a source of the N-channel MOS transistor Qn2400, a source of the P-channel MOS transistor Qp2400, a source of the P-channel MOS transistor Qp2400, a gate of the P-channel MOS transistor Qp2403 and a gate of the N-channel MOS transistor Qn2403. The node N2401 is connected to a drain of the N-channel MOS transistor Qn2400, a drain of the P-channel MOS transistor Qp2401 and a gate of the P-channel MOS transistor Qp2402, and the node N2402 is connected to a drain of the P-channel MOS transistor Qp2400, a drain of the N-channel MOS transistor Qn2401 and a gate of the N-channel MOS transistor Qn2402.

The output signal O24 is connected to a gate of the P-channel MOS transistor Qp2401, a drain of the P-channel MOS transistor Qp2402, a gate of the N-channel MOS transistor Qn2401 and a drain of the N-channel MOS transistor Qn2402. Sources of the P-channel MOS transistors Qp2401 and Qp2402 are connected to the third voltage source VPP. The sources of the N-channel MOS transistors Qn2401 and Qm2403 are connected to the fourth voltage source VBB. A source of the P-channel MOS transistor Qp2402 and a drain of the P-channel MOS transistor Qp2403 are connected together, and a source of the N-channel MOS transistor Qn2402 and a drain of the N-channel MOS transistor Qn2403 are connected together.

The third P-channel MOS transistor Qp2403 forms a first early cut-off circuit 251, and the third N-channel MOS transistor Qn2403 forms a second early cut-off circuit 252.

The voltage level converter circuit 2401 functions similarly to the fourteenth embodiment, and specifically operates to shift the input signal of the amplitudes of the ground voltage source (first voltage source) VSS and the second voltage source VCC to the amplitudes of the third voltage source VPP and the fourth voltage source VBB. Owing to provision of the P-channel MOS transistor Qp2403 and the N-channel MOS transistor Qn2403, the output signal O24 can be set rapidly to the potential of the voltage source VPP or VBB.

[Sixteenth Embodiment]

A sixteenth embodiment of a voltage-level shifter of the invention will be described below.

Figure 26:
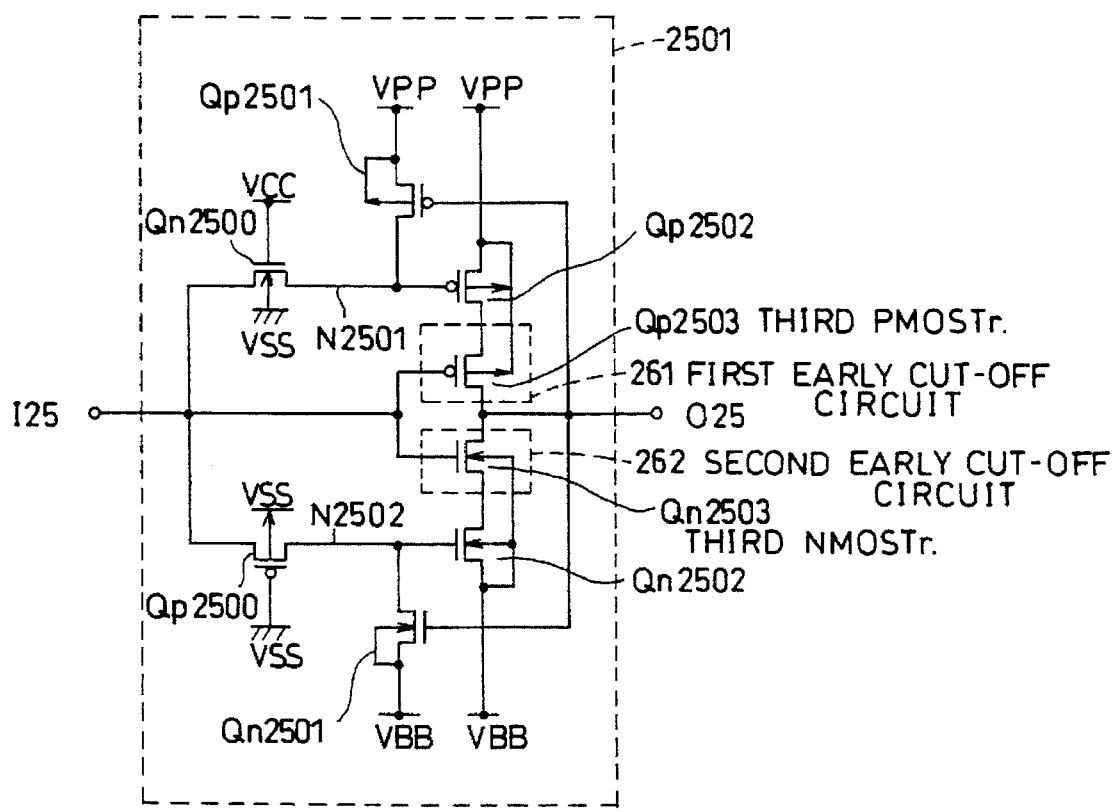
FIG. 26 shows a structure of a sixteenth embodiment of the voltage-level shifter of the invention.

FIG. 26 shows a circuit structure. This embodiment corresponds to composition of the fourteenth and ninth embodiments. In the figure, 2501 indicates a voltage-level shifter, I25 indicates an input signal of the voltage-level shifter 2501, O25 indicates an output signal, VCC indicates the first voltage source, VPP indicates the second voltage source, VSS indicates the ground voltage source, and VBB indicates the third voltage source. Qn2500–Qn2502 indicate N-channel MOS transistors, Qn2503 indicates an N-channel MOS transistor (third N-channel MOS transistor), Qp2500–Qp2502 indicate P-channel MOS transistors, Qp2503 indicates a P-channel MOS transistor (third P-channel MOS transistor), and N2501 and N2502 indicate node names.

The circuit structure in FIG. 26 is similar to that of the fifteenth embodiment except for that the P-channel MOS transistors Qp2402 and Qp2403 are connected in serial in the opposite order, and the N-channel MOS transistors Qn2402 and Qn2403 are connected in serial in the opposite order.

The third P-channel MOS transistor Qp2503 forms a first early cut-off circuit 261, and the third N-channel MOS transistor Qn2503 forms a second early cut-off circuit 262.

The voltage level converter circuit 2501 functions similarly to the fifteenth embodiment, and specifically operates to shift the input signal of amplitudes of the ground voltage source VSS and the second voltage source VCC to the amplitude of the third voltage source VPP and the fourth voltage source VBB. Owing to provision of the P-channel MOS transistor Qp2503 and the N-channel MOS transistor Qn2503, the output signal O25 can be set rapidly to the potential of the voltage source VPP or VBB.

[Seventeenth Embodiment]

A seventeenth embodiment of a voltage-level shifter of the invention will be described below.

Figure 27:
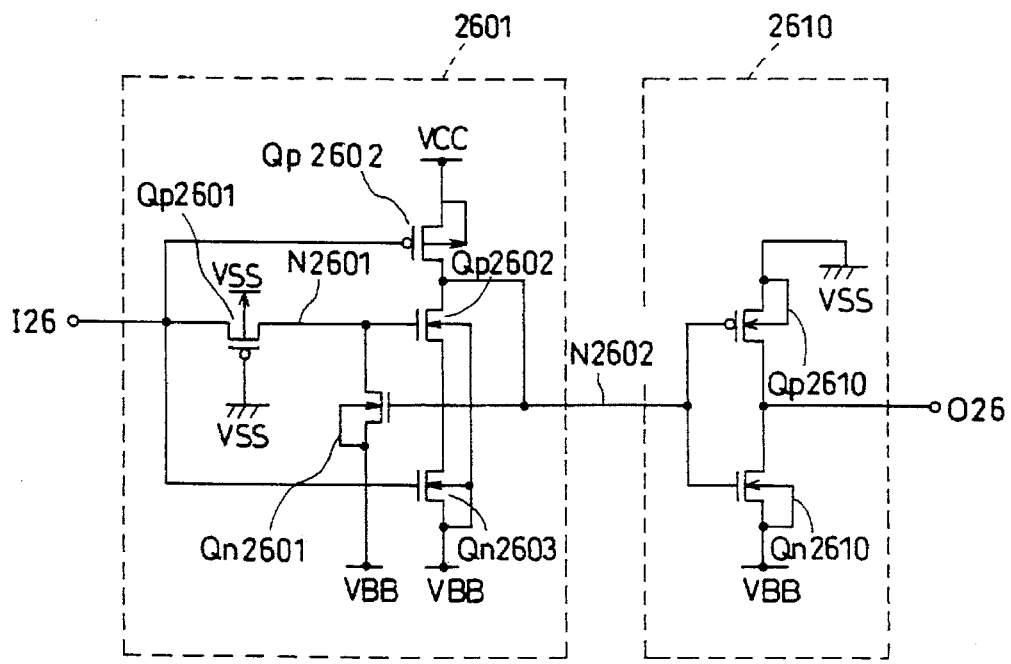
FIG. 27 shows a structure of a seventeenth embodiment of the voltage-level shifter of the invention.

FIG. 27 shows a circuit structure. In the voltage-level shifter of this embodiment, there are provided first, second and third voltage sources, the input signal is inputted with the voltages of the first and second voltage sources, the output signal is outputted with the voltages of the second and third voltage sources, and the voltage of the second voltage source is intermediate the voltages of the first and second voltage sources. 2601 indicates a voltage-level shifter, 2610 indicates a NOT circuit, I26 indicates an input signal of the voltage-level shifter 2601, O25 indicates an output signal of the NOT circuit 2610, VCC indicates the first voltage source, VSS indicates the ground voltage source, and VBB indicates the second voltage source. Qn2601–Qn2610 indicate N-channel MOS transistors, Qp2601–Qp2610 indicate P-channel MOS transistors, and N2601 and N2602 indicate node names.

The circuit structure in FIG. 27 will be described below. In the voltage-level shifter 2601, the input signal I26 is connected to a source of the P-channel MOS transistor Qp2601, a gate of the P-channel MOS transistor Qp2602 and a gate of the N-channel MOS transistor Qn2603. The node 2601 is connected to a drain of the P-channel MOS transistor Qp2601, a drain of the N-channel MOS transistor Qn2601 and a gate of the P-channel MOS transistor Qp2602. The node 2602 is connected to a drain of the P-channel MOS transistor Qp2602, a drain of the N-channel MOS transistor Qn2602 and a gate of the N-channel MOS transistor Qn2601. A source of the P-channel MOS transistor Qp2602 is connected to the second voltage source VPP. Sources of the N-channel MOS transistors Qn2601 and Qn2602 are connected to the third voltage source VBB. A source of the N-channel MOS transistor Qn2602 and a drain of the N-channel MOS transistor Qn2603 are connected together. The NOT circuit 2610, which is formed of the P-channel MOS transistor Qp2610 and the N-channel MOS transistor Qn2610, receives the input signal from the node N2602 and outputs the signal O26. In the NOT circuit 2610, a source of the P-channel MOS transistor Qp2610 is connected to the ground voltage source VSS, and a source of the N-channel MOS transistor Qn2610 is connected to the third voltage source VBB.

Figure 28:
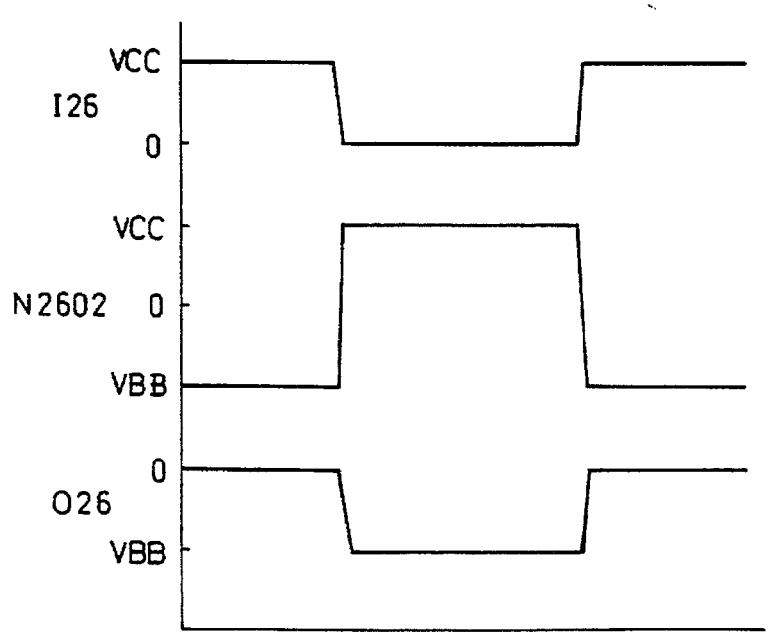
FIG. 28 shows an operation timing of the seventeenth embodiment of the voltage-level shifter of the invention.

As shown in an operation timing diagram of FIG. 28, the voltage-level shifter of the seventeenth embodiment shifts the input signal of the amplitudes of the first voltage source VCC and the ground voltage source VSS to the amplitudes of the ground voltage source VSS and the third voltage source VBB.

[Eighteenth Embodiment]

An eighteenth embodiment of a voltage-level shifter of the invention will be described below.

Figure 29:
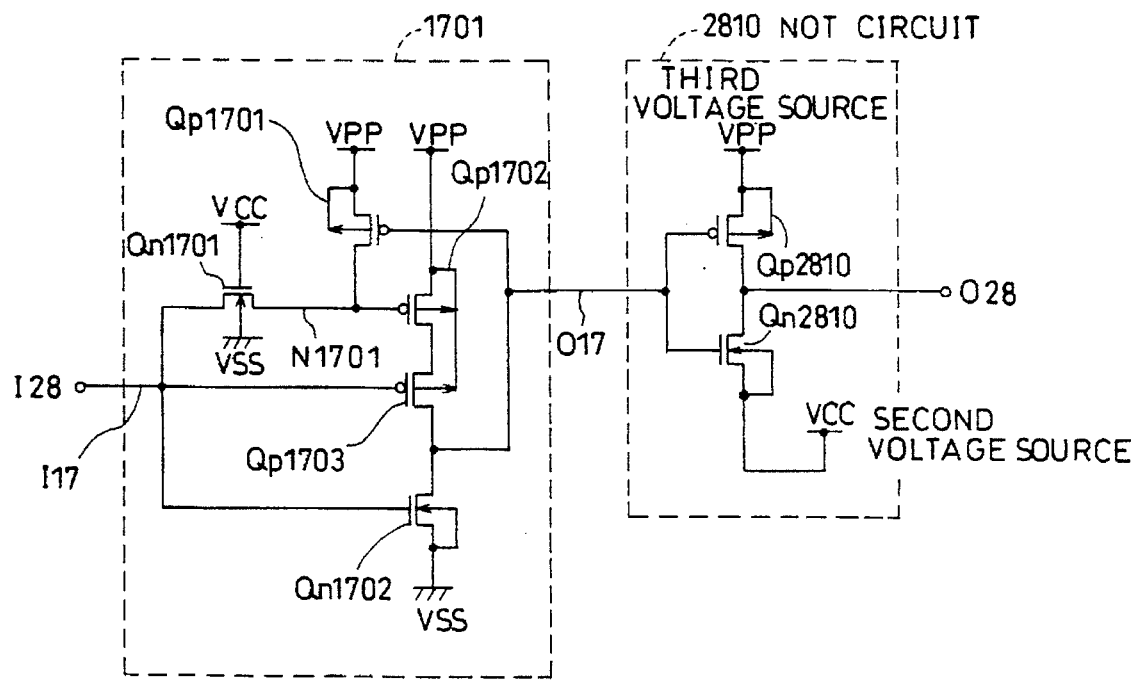
FIG. 29 shows a structure of an eighteenth embodiment of the voltage-level shifter of the invention.

FIG. 29 shows a circuit structure. In this embodiment, there are provided first, second and third voltage sources VSS, VCC and VPP, the input signal is inputted with voltages of the first and second voltage sources VSS and VCC, the output signal is outputted with voltages of the third and second voltage sources VPP and VCC, and the voltage of the third voltage source VPP is higher than the voltage of the second voltage source VCC.

In FIG. 29, 1701 indicates a voltage-level shifter, 2810 indicates a NOT circuit, I28 indicates the input signal of the voltage-level shifter 2801, O17 indicates the output signal of the voltage-level shifter 1701 which is also used as the input signal of the NOT circuit 2810. O28 indicates the output signal of the NOT circuit 2810. VSS indicates the ground voltage source (first voltage source), VCC indicates the second voltage source, and VPP indicates the third voltage source. Qn2801–Qn2810 indicate N-channel MOS transistors, Qp2801–Qp2810 indicate P-channel MOS transistors, and N1701 indicates a node name.

A circuit structure in FIG. 29 will be described below. The voltage-level shifter 1701 is the same as that in The ninth embodiment. The NOT circuit 2810, which is formed of the P-channel MOS transistor Qp2810 and the N-channel MOS transistor Qn2810, receives the signal O17, and outputs the signal O28. In the NOT circuit 2810, a source of the P-channel MOS transistor Qp2810 is connected to the third voltage source VPP, and a source of the N-channel MOS transistor Qn2810 is connected to the second voltage source VCC.

Figure 30:
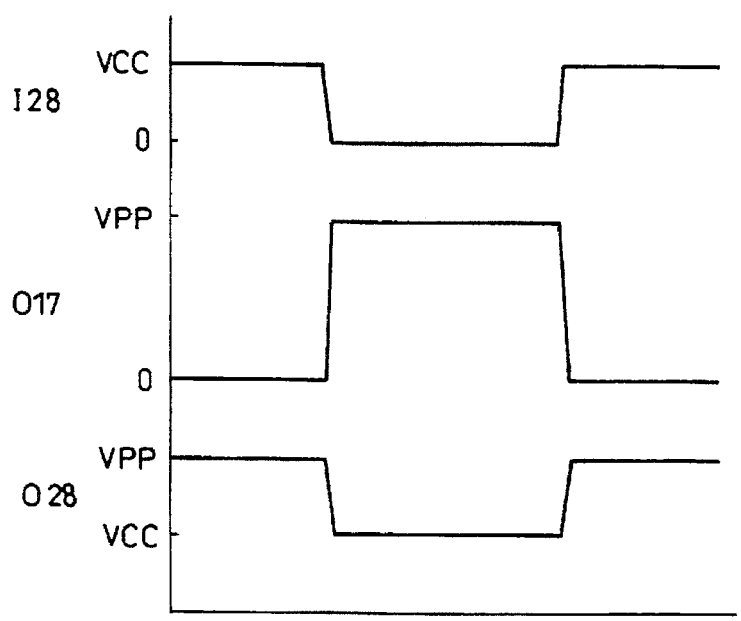
FIG. 30 shows an operation timing of the eighteenth embodiment of the voltage-level shifter of the invention.
Figure 31:
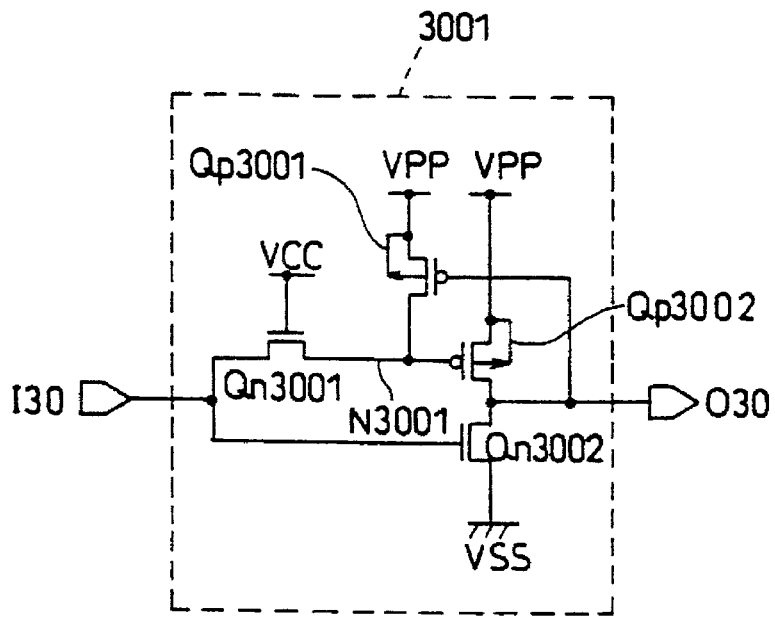
FIG. 31 shows a structure of a voltage-level shifter in the prior art.
Figure 33:
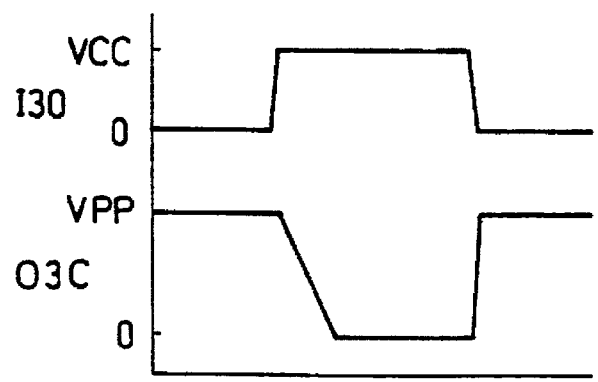
FIG. 33 shows an operation timing of the voltage-level shifter in the prior art.
Figure 32:
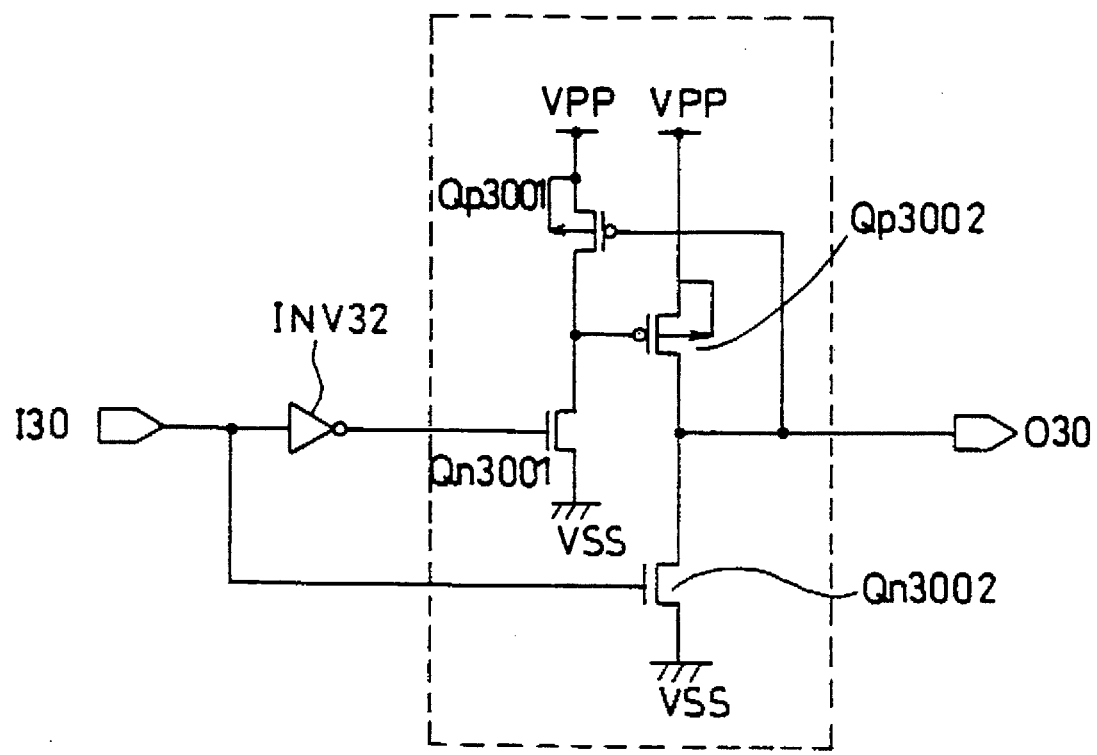
FIG. 32 shows a basic structure of the voltage-level shifter in the prior art.
Figure 34:
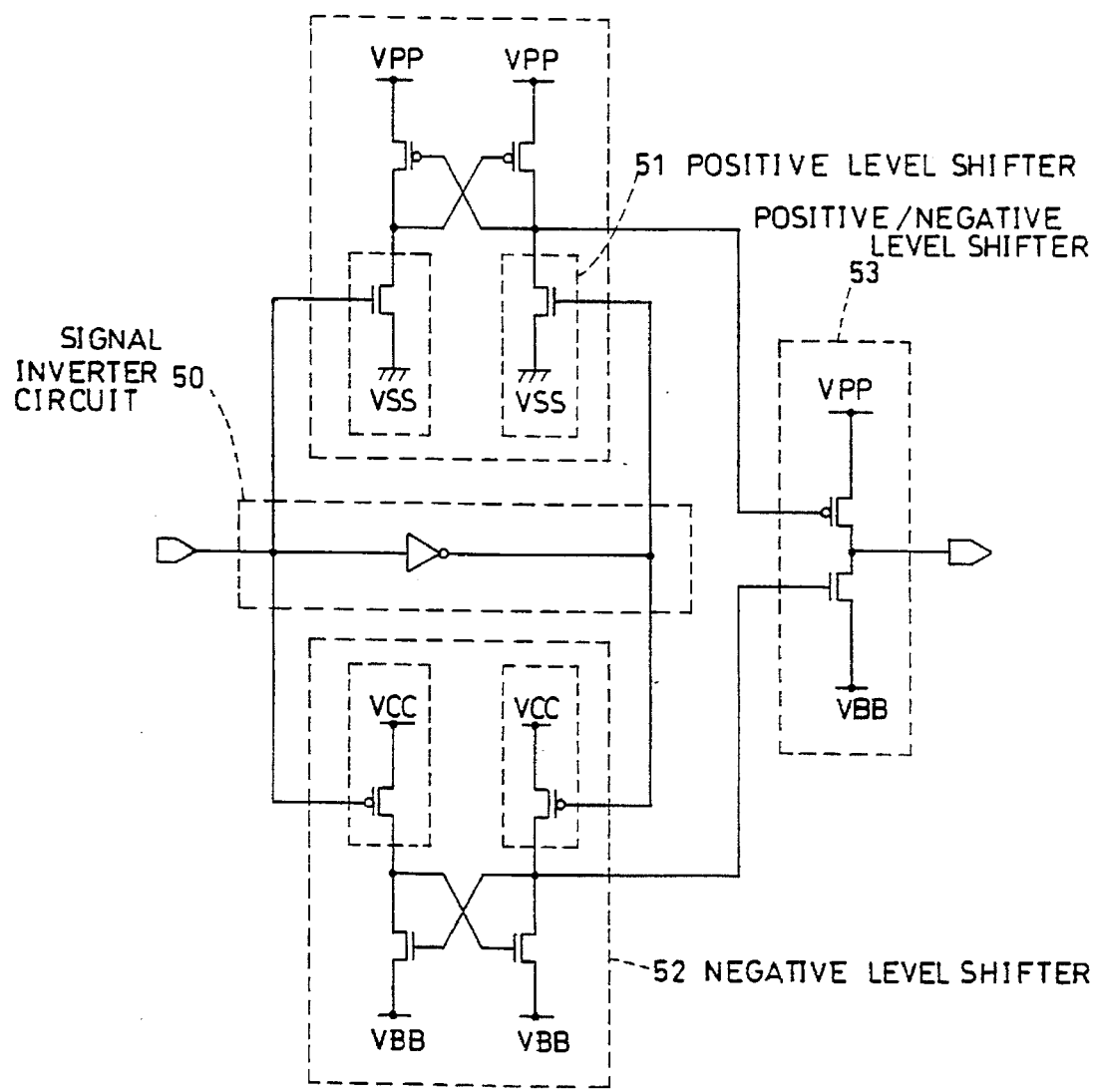
FIG. 34 shows a structure of another conventional voltage-level shifter.

A shown in an operation timing diagram of FIG. 30, the voltage-level shifter of the eighteenth embodiment shifts the input signal of the amplitudes of the second voltage source VCC and the ground voltage source VSS to the amplitudes of the third voltage source VPP and the second voltage source VCC.

The embodiments described above are merely examples, and the invention may be applied to combinations of two or more of these embodiment and other circuits.

What is claimed is:

1. A voltage-level shifter comprising:
   a high voltage power source;
   first and second MOS transistors;
   a first MOS switch element including:
      a source receiving an input signal;
      a gate receiving a different input signal; and
      a drain connected to a drain of said first MOS transistor and a gate of said second MOS transistor; and
   a second MOS switch element including:
      a gate receiving said input signal;
      a source that is grounded; and
      a drain, the potential of which serves as an output signal;
   wherein said high voltage power source is connected to each source of said first and second MOS transistors,
   wherein a gate of said first MOS transistor, a drain of said second MOS transistor and said drain of said second MOS switch element are connected to one another,
   wherein a potential of said input signal changes between a ground potential at a "L" level and a set potential at a "H" level,
   wherein a potential of said different input signal changes between a potential at a different "H" level higher than the set potential and a potential at a different "L" level lower than the potential at the different "H" level,
   wherein said high power voltage source supplies a potential higher than the set potential of said input signal, and
   wherein said output signal transits from the potential supplied by the high voltage power source to the ground potential, while the potential of said input signal transits from the "L" level to the "H" level and the potential of the different input signal transits from the different "L" level to the different "H" level.

2. The voltage-level shifter according to claim 1, wherein each of said first and second MOS transistors includes a P-channel MOS transistor, and
   each of said first and second MOS switch elements includes an N-channel MOS transistor.

3. The voltage-level shifter according to claim 2, further including:
   a signal generating circuit, which generates a signal of a potential exceeding the set potential of said input signal when said input signal transits from the "L" level to the "H" level, and supplies the generated signal to the gate of said first N-channel MOS switch element.

4. The voltage-level shifter according to claim 3, wherein said signal generating circuit includes:
   a NOT circuit inverting the input signal,
   a delay circuit delaying an output signal of said NOT circuit for a predetermined time and inverting the same,
   an NOR gate producing a signal by negating a logical sum of the output signal of said NOT circuit and the output signal of said delay circuit,
   a third N-channel MOS transistor having a source and a gate connected to a voltage source of the input signal, and
   a capacitor connected between a drain of said third N-channel MOS transistor and said NOR gate; and
   a signal of a potential exceeding the set potential of said input signal generated at the drain of said third N-channel MOS transistor.

5. The voltage-level shifter according to claim 2, further including:
   a signal generating circuit, which generates a signal of a potential exceeding the set potential of said input signal prior to transition of said input signal from the "L" level to the "H" level, and supplies the generated signal to the gate of said first N-channel MOS switch element.

6. The voltage-level shifter according to claim 2, further including:
   a signal potential raising circuit, which generates a signal of a potential exceeding the set potential of said input signal when said input signal transits from the "L" level to the "H" level, and supplies the generated signal to the gate of said second N-channel MOS switch element.

7. The voltage-level shifter according to claim 2, further including:
   a signal generating circuit which generates a signal of a potential exceeding the set potential of said input signal prior to transition of said input signal from the "L" level to the "H" level, and supplies the generated signal to the gate of said first N-channel MOS switch element; and
   a signal potential raising circuit which generates a signal of a potential exceeding the set potential of said input signal when said input signal transits from the "L" level to the "H" level, and supplies the generated signal to the gate of said second N-channel MOS switch element.

8. The voltage-level shifter according to claim 5 or 7, wherein said signal generating circuit includes:
   a NOT circuit inverting the input signal;

a delay circuit delaying an output signal of said NOT circuit for a predetermined time and inverting the same;

an NOR gate producing a signal by negating a logical sum of the output signal of said NOT circuit and the output signal of said delay circuit;

a third N-channel MOS transistor having a source and a gate connected to a voltage source of the input signal; and a capacitor connected between a drain of said third N-channel MOS transistor and said NOR gate;

wherein the output signal of said delay circuit forms the input signal; and wherein a signal of a potential exceeding the set potential of said input signal is generated at the drain of said third N-channel MOS transistor.

9. The voltage-level shifter according to claim 6 or 7, wherein said first N-channel MOS switch element has a gate connected to a voltage source of the input signal; and said signal potential raising circuit comprises a series circuit including a signal delay circuit for delaying the input signal and a capacitor connected together in series, said capacitor in said series circuit being connected to a gate of said second P-channel MOS transistor.

10. The voltage-level shifter according to claim 3, further including:

a potential control circuit which controls a potential of the gate of said first N-channel MOS transistor to a potential of a voltage source of the output signal sent from said level shifter when the input signal is at the "L" level, and controls the potential of the gate of said first N-channel MOS transistor to a potential of a voltage source of the input signal sent to said level shifter when the input signal is at the "H" level.

11. The voltage-level shifter according to claim 10, further including:

a third P-channel MOS transistor and a fourth N-channel MOS transistor connected in series as well as fourth and fifth P-channel MOS transistors;

each of said third P-channel MOS transistor and said fourth N-channel MOS transistor receives on its gate the output signal of said level shifter, said third P-channel MOS transistor is connected to the voltage source of said level shifter, and said fourth N-channel MOS transistor is grounded;

said fourth P-channel MOS transistor has a source connected to the voltage source of said level shifter, a gate connected to a connection between said third P-channel MOS transistor and said fourth N-channel MOS transistor, and a drain connected to the gate of said first N-channel MOS switch element; and said fifth P-channel MOS transistor has a source connected to the voltage source of the input signal, a gate receiving the output signal of said level shifter, and a drain connected to the gate of said first N-channel MOS switch element.

12. The voltage-level shifter according to claim 2, further including:

a potential control circuit which controls a potential of the gate of said first N-channel MOS transistor to a potential of a voltage source of the output signal sent from said level shifter when the input signal is at the "L" level, and controls the potential of the gate of said first N-channel MOS transistor to a ground potential when the input signal is at the "H" level, and a third N-channel MOS switch element connected in parallel to said first N-channel MOS transistor, which controls a potential of a gate of said third N-channel MOS switch element to the ground potential when the input signal is at the "L" level, and controls the potential of the gate of said third N-channel MOS switch element to the potential of the voltage source circuit when the input signal is at the "H" level.

13. The voltage-level shifter according to claim 12, further including:

a sixth P-channel MOS transistor and a fifth N-channel MOS transistor connected in series with a sixth N-channel MOS transistor;

each of said sixth P-channel MOS transistor and said fifth N-channel MOS transistor receives on its gate the output signal of said level shifter, said sixth P-channel MOS transistor is connected to the voltage source of the input signal, and said fifth N-channel MOS transistor is grounded;

said sixth N-channel MOS transistor has a source receiving the input signal, a gate connected to a connection between said sixth P-channel MOS transistor and said fifth N-channel MOS transistor, and a drain connected to the drain of said first N-channel MOS transistor; and said first N-channel MOS switch element receives on its gate the output signal of said level shifter.

14. The voltage-level shifter according to claim 12, further including:

a seventh N-channel MOS transistor;

said seventh N-channel MOS transistor receives on its source and gate the input signal, and has a drain connected to said first N-channel MOS switch element; and said first N-channel MOS switch element receives on its gate the output of said level shifter.

15. A voltage-level shifter comprising:

a voltage power source;

a high voltage power source having a voltage higher than that of said voltage power source;

first and second MOS transistors;

a first MOS switch element including:
    a source receiving an input signal;
    a gate connecting said voltage power source; and
    a drain connected to a drain of said first MOS transistor and a gate of said second MOS transistor;

a second MOS switch element including:
    a gate receiving said input signal;
    a source that is grounded; and
    a drain, the potential of which serves as an output signal; and an early cut-off circuit, wherein said high voltage power source is connected to each source of said first and second MOS transistors, and said early cut-off circuit;

wherein a gate of said first MOS transistor, a drain of said second MOS transistor and said drain of said second MOS switch element are connected to one another, wherein said early cut-off circuit is operable at one of the positions between said high voltage power source and the source of said second MOS transistor, between the drain of said second MOS transistor and the gate of said first MOS transistor, between said high voltage power source and the source of said first MOS transistor, and between the drain of said first MOS transistor and the gate of said second MOS transistor, and is turned off at a timing earlier than an off timing of said second MOS transistor when said input signal transits from the "L" level to the "H" level, wherein a potential of said input signal changes between a ground potential at a "L" level and a set potential at a "H" level, wherein said high power voltage source supplies a potential higher than the set potential of said input signal, wherein said output signal transits from the potential supplied by the high voltage power source to the ground potential, while the potential of said input signal transits from the "L" level to the "H" level.

16. The voltage-level shifter according to claim 15, wherein each of said first and second MOS transistors includes a P-channel MOS transistor, and each of said first and second MOS switch elements includes an N-channel MOS transistor.

17. The voltage-level shifter according to claim 16, wherein said early cut-off circuit includes a seventh P-channel MOS transistor of the same conductivity type as said second P-channel MOS transistor, and said seventh P-channel MOS transistor receives on its gate the input signal.

18. The voltage-level shifter according to claim 15, further comprising a NOT circuit producing a NOT signal of the output signal of said level shifter; and said NOT circuit uses as its power sources a second voltage source of a potential not lower than a potential of the voltage source of the input signal sent as a third voltage source of a potential higher than the potential of said second voltage source, and is operable to output a signal of which voltage source is said third voltage source when the output signal of said level shifter is at the "H" level, and to output a signal of which voltage source is said second voltage source when the output signal of said level shifter is at the "L" level.

19. A voltage-level shifter comprising:

a plurality of voltage level shifter units connected in series;

each of said voltage level shifter units receiving a input signal, the potential of which changes between a set potential and a different set potential other than the set potential, and converting the input signal, in accordance with the level change in the potential of the input signal, to a signal, the potential of which changes the set potential and a potential higher than the different set potential;

said voltage level shifter unit at an initial stage receiving an external signal as its input signal, and each of said voltage level shifter units other than said voltage level shifter unit at the initial stage receiving the output signal of said voltage level shifter unit at a preceding stage as its input signal; and each of said voltage level shifter units having a power source forming a voltage source of its own output signal and generating a potential lower than that of the voltage source at a preceding stage.

20. The voltage-level shifter according to claim 19, wherein each of said voltage shifter units following the initial stage has a logic circuit, each said logic circuit of each voltage shifter unit connected together in series, and each using, as a voltage source, a voltage source generating the potential of the input signal sent to said voltage level shifting unit at the initial stage.

said logic circuit at the initial stage using as its input signal the input signal sent to said voltage level shifting unit at the initial stage, each said logic circuit following the initial stage using as its input signal the output signal of the logic circuit at the preceding stage, each of said voltage level shifting units following the initial stage includes a potential fixing circuit receiving the output signal of its own logic circuit and fixing a potential of its own output signal at an early timing.

21. The voltage-level shifter according to claim 20, wherein each of said logic circuits includes a NOT circuit inverting the input signal.

22. A voltage-level shifter for receiving a signal of predetermined amplitude and outputting a signal of an amplitude larger than that of said input signal, comprising:

a first N-channel MOS switch element and a first P-channel MOS switch element;

first and second N-channel MOS transistors, and first and second P-channel MOS transistors;

first and second voltage sources forming voltage sources of said input signal, and third and fourth voltage sources forming voltage sources of said output signal;

said first N-channel MOS switch element being connected to a gate of said second P-channel MOS transistor, and a potential of said first voltage source being supplied to the gate of said second P-channel MOS transistor in accordance with the potential of said input signal;

said first P-channel MOS switch element being connected to a gate of said second N-channel MOS transistor, a potential of said second voltage source being supplied to the gate of said second N-channel MOS transistor in accordance with the potential of said input signal;

a drain of said first P-channel MOS transistor being connected to a gate of said second P-channel MOS transistor;

a drain of said first N-channel MOS transistor being connected to a gate of said second N-channel MOS transistor:

sources of said first and second P-channel MOS transistors being connected to said third voltage source;

sources of said first and second N-channel MOS transistors being connected to said fourth voltage source;

a gate of said first P-channel MOS transistor, a drain of said second P-channel MOS transistor, a gate of said first N-channel MOS transistor and a drain of said second N-channel MOS transistor being connected together to form a common connection;

a potential of said common connection being used as said output signal; and first and second early-cut-off circuits;

said first early cut-off circuit operable at one of the positions between said third voltage source of the output signal and the source of said second P-channel MOS transistor, between the drain of said second P-channel MOS transistor and the gate of said first P-channel MOS transistor, between said third voltage source of said output signal and the source of said first P-channel MOS transistor, and between the drain of said first P channel MOS transistor and the gate of said second P-channel MOS transistor, and is turned off at a timing earlier than an of timing of said second P-channel MOS transistor when said input signal transits from the "L" level to the "H" level; and said second early cut-off circuit operable at one of the positions between said fourth voltage source of the output signal and the source of said second N-channel MOS transistor, between the drain of said second N-channel MOS transistor and the gate of said first N-channel MOS transistor, between said fourth voltage source of said output signal and the source of said first N-channel MOS transistor, and between the drain of said first N-channel MOS transistor and the gate of said second N-channel MOS transistor, and is turned off at a timing earlier than an of timing of said second N-channel MOS transistor when said input signal transits from the "L" level to the "H" level, wherein said first and second cut-off circuits are provided for defining at an early timing the output signal having a larger amplitude than the "L" signal after the transition of the input signal from the "L" level to the "H" level.

23. The voltage-level shifter according to claim 22, wherein said first early cut-off circuit includes the third P-channel MOS transistor, which receives on its gate the input signal of said voltage-level shifter.

24. The voltage-level shifter according to claim 22, wherein said second early cut-off circuit includes the third N-channel MOS transistor, which receives on its gate the input signal of said voltage-level shifter.

25. A voltage-level shifter for receiving a signal of predetermined amplitude and outputting an output signal having an amplitude larger than that of the input signal, comprising:

a first N-channel MOS switch element and a first P-channel MOS switch element;

first and second N-channel MOS transistors, and first and second P-channel MOS transistors; and first and second voltage sources and third and fourth voltage sources forming voltage sources of the output signal, wherein a drain of the first P-channel MOS switch element is connected to a gate of the second P-channel MOS transistor, wherein a source of the first N-channel MOS switch element is connected to the first voltage source, wherein a drain of the first P-channel MOS switch element is connected to a gate of the second N-channel MOS transistor, wherein a source of the first P-channel MOS switch element is connected to the second voltage source, wherein gates of the first N-channel MOS switch element and the first P-channel MOS switch element commonly receive the input signal, wherein a drain of the first P-channel MOS transistor is connected to the gate of the second P-channel MOS transistor, wherein a drain of the first N-channel MOS transistor is connected to the gate of the second N-channel MOS transistor, wherein sources of the first and second P-channel MOS transistors are connected to the third voltage source, wherein sources of the first and second N-channel MOS transistors are connected to said fourth voltage source, wherein a gate of the first P-channel MOS transistor, a drain of the second P-channel MOS transistor, a gate of the first N-channel MOS transistor and a drain of the second N-channel MOS transistor directly connected together to form a common connection, and wherein a potential of the common connection is used as the output signal.

* * * * *

UNITED STATES PATENT AND TRADEMARK OFFICE
CERTIFICATE OF CORRECTION

PATENT NO. : 5,650,742
DATED : July 22, 1997
INVENTOR(S) : Hiroshige HIRANO

It is certified that error appears in the above-identified patent and that said Letters Patent is hereby corrected as shown below:

Col. 27, line 25: "3" should read --2--

Signed and Sealed this

Twenty-second Day of September, 1998

Attest:

BRUCE LEHMAN

Attesting Officer

Commissioner of Patents and Trademarks